United States Patent
Kojima

(10) Patent No.: US 7,432,765 B2
(45) Date of Patent: Oct. 7, 2008

(54) VARIABLE GAIN AMPLIFIER, MIXER AND QUADRATURE MODULATOR USING THE SAME

(75) Inventor: Iwao Kojima, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 87 days.

(21) Appl. No.: 11/391,180

(22) Filed: Mar. 29, 2006

(65) Prior Publication Data

US 2006/0220743 A1 Oct. 5, 2006

(30) Foreign Application Priority Data

Mar. 30, 2005 (JP) .............................. P2005-097832

(51) Int. Cl.
*H03G 3/12* (2006.01)
(52) U.S. Cl. ...................................... 330/283; 330/288
(58) Field of Classification Search ................. 330/283, 330/288, 278; 323/315, 316
See application file for complete search history.

(56) References Cited

U.S. PATENT DOCUMENTS

| | | | | |
|---|---|---|---|---|
| 5,479,135 A | * | 12/1995 | Kubinec | ................... 330/277 |
| 5,627,486 A | * | 5/1997 | Gross | ...................... 327/108 |
| 6,175,278 B1 | | 1/2001 | Hasegawa | |
| 6,184,752 B1 | | 2/2001 | Dautriche | |
| 6,300,832 B1 | | 10/2001 | Okazaki | |
| 6,300,845 B1 | * | 10/2001 | Zou | ...................... 332/178 |
| 2003/0034841 A1 | | 2/2003 | Fujimura et al. | |
| 2003/0141932 A1 | | 7/2003 | Toyota et al. | |

FOREIGN PATENT DOCUMENTS

| | | |
|---|---|---|
| JP | 11-340760 | 12/1999 |
| JP | 2000-232328 | 8/2000 |
| JP | 2003-23331 | 1/2003 |
| JP | 2003-218649 | 7/2003 |
| JP | 2003-229735 | 8/2003 |

* cited by examiner

*Primary Examiner*—Henry K Choe
(74) *Attorney, Agent, or Firm*—Wenderoth, Lind & Ponack, L.L.P.

(57) ABSTRACT

A variable gain amplifier includes a voltage-to-current converter for converting the input voltage to a current, a current amplifier for amplifying the current converted by the voltage-to-current converter, a current-to-voltage converter for converting the current amplified by the current amplifier into a voltage, and a controller for controlling an amplification factor of the current amplifier.

30 Claims, 12 Drawing Sheets

VARIABLE GAIN AMPLIFIER, MIXER AND QUADRATURE MODULATOR USING THE SAME

BACKGROUND OF THE INVENTION

1. Field of the Invention

The present invention relates to a variable gain amplifier for use in such as a transmission section of, for example, a CDMA wireless terminal, and a mixer and a quadrature modulator that use such a variable gain amplifier.

2. Description of the Related Art

As a code division multiple access (CDMA) scheme has come to be utilized more and more, research and development has been greatly advancing on a radio that accommodates CDMA (hereinafter referred to as "CDMA wireless terminal"). For a transmission section of the CDMA wireless terminal, it is indispensable to conduct transmission power control of 70 dB or more, so that a variable gain amplifier plays a major role in this power control. The variable gain amplifier for use in the transmission section has requirements of (1) low dissipation power, (2) low distortion, and (3) ensuring gain continuity. Specifically, "low dissipation power" means that it is possible to set to low dissipation power when a gain and an output level are low in level, "low distortion" means that a saturation input level remains unchanged even if a gain changes, and "ensuring gain continuity" means that a gain can be changed continuously.

For example, in one of conventional variable gain amplifiers, a gain is controlled by a gain control circuit having a plurality of differential amplifiers (see Japanese Patent Application Laid Open No. 2000-232328, for example). These differential amplifiers are each made of two transistors in such a configuration that a base of one of the two transistors and that of the counterpart transistor are commonly connected and bases of the other transistors are connected to different reference voltage terminals. Further, collectors of the two transistors of each of the differential amplifiers are commonly connected and a load resistor of each of the transistors is constituted of a resistor element. The commonly-connected base of one of the transistors of each of the differential amplifiers is supplied with a voltage proportional to a thermal voltage which is obtained by converting an externally applied first gain-control voltage. An output voltage of each of the differential amplifiers is supplied via a buffer to the variable gain amplifier as a second gain-control voltage. The variable gain amplifier in which a gain is controlled by such a gain control circuit has a feature of ensuring continuity of a gain with respect to an externally applied gain control voltage with its relative simple configuration and improving linearity of that gain. Hereinafter, the term "gain control voltage" means a gain control signal in the description.

Another conventional variable gain amplifier has a first differential amplification circuit constituted of a first couple of transistors and a second differential amplification circuit constituted of a second couple of transistors (see Japanese Patent Application Laid Open No. 2003-023331, for example). In this variable gain amplifier, when an externally applied gain-control voltage increases, a bias current of the first differential amplifier having a larger gain increases, so that the gain of the first differential amplifier is increased, thereby increasing an overall gain. If the externally applied gain control voltage decreases, on the other hand, a bias current of the second differential amplifier having a smaller gain increases, so that the gain of the second differential amplifier is increased and hence its influence is increased, thus resulting in an amplification circuit having a higher saturation input level and a lower gain. In this configuration, as a gain increases, a bias current of the second differential amplifier decreases, so that dissipation power can be reduced. That is, this variable gain amplifier features that dissipation power can be reduced.

In a further conventional variable gain amplifier, when converting an input voltage into a current and amplifying this converted current to output the resulting current, a quantity of the output current is controlled by changeover of switches in accordance with an externally applied gain control voltage (see Japanese Patent Application Laid Open No. H11-340760, for example). This variable gain amplifier has a feature that a dissipation current can be reduced if a gain is low.

Furthermore, in some other conventional variable gain amplifiers, a bias current generation circuit that supplies a bias current to a linear amplifier constituting a communication high-frequency power amplification circuit is comprised of a plurality of variable-current sources having different current values at starting levels, and these variable current sources are controlled by using an input control voltage. Then, the resultant controlled currents may be combined into a bias current and this combined current may change exponentially with respect to the input control voltage (see Japanese Patent Application Laid Open No. 2003-218649, for example).

A still further conventional variable gain amplifier is comprised of a mutual conductance amplifier having a degenerate impedance element and a variable-current source that is arranged to supply a current to this mutual conductance amplifier and that is configured so that the current may change simultaneously with an effective degenerate impedance of the mutual conductance amplifier, in accordance with a gain control voltage ($V_{GC}$) (see Japanese Patent Application Laid Open No. 2003-229735, for example).

However, a variable gain amplifier in which a gain is controlled by a gain control circuit having a plurality of differential amplifiers has a disadvantage that a dissipation current cannot be changed for each of the gains. Another variable gain amplifier having two differential amplifiers has a disadvantage that, although a saturation input level is low at most of intermediate level gains, the saturation input level increases if an influence of the first differential amplification circuit is reduced due to an increase in bias current of the second differential amplification circuit having a smaller gain, that is, the saturation input level fluctuates. A further variable gain amplifier for controlling a quantity of a current by changeover of switches has a disadvantage that it can conduct only discrete gain control on an externally applied gain control voltage but cannot conduct continuous control thereon.

That is, the conventional variable gain amplifiers have a problem that they cannot satisfy the above-described three features of: (1) low dissipation power that low dissipation power can be set if a gain is low and hence an output level is low, (2) low distortion that a saturation input level remains unchanged even if a gain changes, and (3) gain continuity that a continuous gain can be ensured.

SUMMARY OF THE INVENTION

The present invention has been made to solve the above-described problems, and aims to provide a variable gain amplifier that satisfies the three features of lower power dissipation, low distortion, and gain continuity simultaneously, and to provide a mixer and a quadrature modulator that utilize such a variable gain amplifier.

A variable gain amplifier according to the present invention amplifies an input voltage at a variable gain and outputs the amplified voltage. The variable gain amplifier includes a voltage-to-current converter for converting the input voltage into a current; a current amplifier for amplifying the current converted by the voltage-to-current converter; a current-to-voltage converter for converting the current amplified by the current amplifier into a voltage and outputting the resulting voltage; and a controller for controlling the gain of the variable gain amplifier by varying an amplification factor of the current amplifier in accordance with a gain control signal. Hereinafter, this variable gain amplifier is referred to as a "first variable gain amplifier".

Preferably, in the first variable gain amplifier, the current amplifier has a current mirror circuit to which a current converted by the voltage-to-current converter is inputted, the controller varies a ratio of an output current to an input current of the current mirror circuit in accordance with the gain control signal, and the current-to-voltage converter converts an output current of the current mirror circuit into a voltage and outputs the resulting voltage. Hereinafter, this variable gain amplifier is referred to as a "second variable gain amplifier".

Preferably, in the second variable gain amplifier, the current mirror circuit includes an input-side transistor through which the current converted by the voltage-to-current converter flows; an output-side transistor through which a current proportional to the current flowing through the input-side transistor flows; and a variable resistor connected in series to the output-side transistor. The current-to-voltage converter converts the current flowing through the output-side transistor into a voltage and outputs the resulting voltage, and the controller varies a resistance of the variable resistor in accordance with the gain control signal. Hereinafter, this variable gain amplifier is referred to as a "third variable gain amplifier".

Preferably, in the third variable gain amplifier, the variable resistor is constituted of an MOS transistor, and the controller varies a control voltage of the MOS transistor in accordance with the gain control signal. Hereinafter, this variable gain amplifier is referred to as a "fourth variable gain amplifier".

Preferably, in the first variable gain amplifier, the current amplifier has a plurality of current amplification circuits each amplifying the current converted by the voltage-to-current converter and outputting the amplified current, the controller varies an amplification factor of each of the current amplification circuits in accordance with the gain control signal, and the current-to-voltage converter converts a total sum of currents outputted from the current amplification circuits into a voltage. Hereinafter, this variable gain amplifier is referred to as a "fifth variable gain amplifier".

Preferably, in the fifth variable gain amplifier, when N and n are integers equal to or larger than 2, $\alpha_0$ and A are arbitrary constants, and a relation of $1<n<N+1$ is established, given that the number of the current amplification circuits is N, a maximum current amplification factor $N_n$ of the n-th current amplification circuit is $\alpha_0 \times (A-1) \times A^{(n-2)}$. Hereinafter, this variable gain amplifier is referred to as a "sixth variable gain amplifier".

Preferably, in the fifth or sixth variable gain amplifier, the voltage-to-current converter has a pair of first and second transistors through each of which a current converted from the input voltage flows, each of the current amplification circuits has a pair of third and fourth transistors to constitute a group of third transistors and a group of fourth transistors in the current amplifier. Base electrodes of the group of the third transistors are commonly connected to the base of the first transistor and collector electrodes of the group of the third transistors are commonly connected so that a current proportional to a current flowing through the first transistor flows through each of the group of the third transistors. Base electrodes of the group of the fourth transistors are commonly connected to the base of the second transistor and collector electrodes of the group of the fourth transistors are commonly connected so that a current proportional to a current flowing through the second transistor flows through each of the group of the fourth transistors. The controller varies a quantity of a current flowing through each of the third and fourth transistors in accordance with the gain control signal, and the current-to-voltage converter converts a total sum of currents flowing through the group of the third transistors and the group of the fourth transistors into a voltage. Hereinafter, this variable gain amplifier is referred to as a "seventh variable gain amplifier".

Preferably, in the seventh variable gain amplifier, each of the current amplification circuits has a variable resistor connected in series to each of the third transistors and a variable resistor connected in series to each of the fourth transistors, and the controller varies a resistance of each of the variable resistors in accordance with the gain control signal. Hereinafter, this variable gain amplifier is referred to as an "eighth variable gain amplifier".

Preferably, in the seventh variable gain amplifier, each of the current amplification circuits has a MOS transistor connected in series to each of the third transistors and a MOS transistor connected in series to each of the fourth transistors, and the controller varies a control voltage of each of the MOS transistors in accordance with the gain control signal, thereby varying a quantity of a current flowing through each of the third and fourth transistors. Hereinafter, this variable gain amplifier is referred to as a "ninth variable gain amplifier".

Preferably, in the ninth variable gain amplifier, the controller has a constant voltage generator that generates a constant voltage to be applied to each of the current amplification circuits and a plurality of control voltage generators each of which generates and outputs a control voltage to be applied to each pair of the MOS transistors in each of the current amplification circuits. Each of the control voltage generators has a differential amplification circuit to which a constant voltage generated by the constant voltage generator and a voltage of the gain control signal are inputted to the input terminals thereof, respectively, a current mirror circuit whose input-side transistor constitutes a load of one of a couple of differential transistors of the differential amplification circuit, and a voltage output section for converting an output current of the current mirror circuit into a voltage and outputting the resultant converted voltage. Hereinafter, this variable gain amplifier is referred to as a "tenth variable gain amplifier".

Preferably, in any one of the first through tenth variable gain amplifiers, the current-to-voltage converter may be provided with a resistor.

Preferably, in any one of the first through tenth variable gain amplifiers, the current-to-voltage converter may be provided with an inductor.

Preferably, in any one of the first through tenth variable gain amplifiers, the current-to-voltage converter may be provided with an inductor and a capacitor connected in parallel to each other.

A mixer according to the present invention converts a frequency of an input voltage in accordance with a conversion gain control signal supplied from an outside and outputs the resulting voltage having a frequency converted. The mixer includes a voltage-to-current converter for converting the input voltage into a current; a current amplifier for amplifying the current converted by the voltage-to-current converter; a controller for controlling an amplification factor of the current amplifier in accordance with a gain control signal; a mixing unit for converting the frequency of the current amplified by the current amplifier, in accordance with the conversion gain control signal; and a current-to-voltage converter for converting the resulting frequency-converted current into a voltage. Hereinafter, this mixer is referred to as a "first mixer".

Preferably, in the first mixer, the current amplifier has a current mirror circuit to which a current converted by the voltage-to-current converter is inputted, the controller varies a ratio of an output current to an input current of the current mirror circuit in accordance with the gain control signal, and the current-to-voltage converter converts an output current of the current mirror circuit into a voltage and outputs the resulting voltage. Hereinafter, this mixer is referred to as a "second mixer".

Preferably, in the second mixer, the current mirror circuit includes an input-side transistor through which the current converted by the voltage-to-current converter flows; an output-side transistor through which a current proportional to the current flowing through the input-side transistor flows; and a variable resistor connected in series to the output-side transistor. The current-to-voltage converter converts the current flowing through the output-side transistor into a voltage and outputs the resulting voltage, and the controller varies a resistance of the variable resistor in accordance with the gain control signal. Hereinafter, this mixer is referred to as a "third mixer".

Preferably, in the third mixer, the variable resistor is constituted of a MOS transistor and the controller varies a control voltage of the MOS transistor in accordance with the gain control signal. Hereinafter, this mixer is referred to as a "fourth mixer".

Preferably, in the first mixer, the current amplifier has a plurality of current amplification circuits each amplifying the current converted by the voltage-to-current converter and outputting the amplified current, the controller varies an amplification factor of each of the current amplification circuits in accordance with the gain control signal, and the current-to-voltage converter converts a total sum of currents outputted from the current amplification circuits into a voltage. Hereinafter, this mixer is referred to as a "fifth mixer".

Preferably, in the fifth mixer, when N and n are integers equal to or larger than 2, $\alpha_0$ and A are arbitrary constants, and a relation of $1<n<N+1$ is established, given that the number of the current amplification circuits is N, a maximum current amplification factor $N_n$ of the n-th current amplification circuit is $\alpha_0 \times (A-1) \times A^{(n-2)}$. Hereinafter, this mixer is referred to as a "sixth mixer".

Preferably, in the fifth or sixth mixer, the voltage-to-current converter has a pair of first and second transistors through each of which a current converted from the input voltage flows, each of the current amplification circuits has a pair of third and fourth transistors to constitute a group of third transistors and a group of fourth transistors in the current amplifier. Base electrodes of the group of the third transistors are commonly connected to the base of the first transistor and collector electrodes of the group of the third transistors are commonly connected so that a current proportional to a current flowing through the first transistor flows through each of the group of the fourth transistors. Base electrodes of the group of the fourth transistors are commonly connected to the base of the second transistor and collector electrodes of the group of the fourth transistors are commonly connected so that a current proportional to a current flowing through the second transistor flows through each of the group of the fourth transistors. The controller varies a quantity of a current flowing through each of the third and fourth transistors in accordance with the gain control signal, and the current-to-voltage converter converts a total sum of currents flowing through the group of the third transistors and the group of the fourth transistors into a voltage. Hereinafter, this mixer is referred to as a "seventh mixer".

Preferably, in the seventh mixer, each of the current amplification circuits has a variable resistor connected in series to each of the third transistors and a variable resistor connected in series to each of the fourth transistors, and the controller varies a resistance of each of the variable resistors in accordance with the gain control signal. Hereinafter, this mixer is referred to as an "eighth mixer".

Preferably, in the seventh mixer, each of the current amplification circuits has a MOS transistor connected in series to each of the third transistors and a MOS transistor connected in series to each of the fourth transistors, and the controller varies a control voltage of each of the MOS transistors in accordance with the gain control signal, thereby varying a quantity of a current flowing through each of the third and fourth transistors. Hereinafter, this mixer is referred to as a "ninth mixer".

Preferably, in the ninth mixer, the controller has a constant voltage generator that generates a constant voltage to be applied to each of the current amplification circuits and a plurality of control voltage generators each of which generates and outputs a control voltage to be applied to each pair of the MOS transistors in each of the current amplification circuits. Each of the control voltage generators has a differential amplification circuit to which a constant voltage generated by the constant voltage generator and a voltage of the gain control signal are inputted to the input terminals thereof, respectively, a current mirror circuit whose input-side transistor constitutes a load of one of a couple of differential transistors of the differential amplification circuit, and a voltage output section for converting an output current of the current mirror circuit into a voltage and outputting the resultant converted voltage. Hereinafter, this mixer is referred to as a "tenth mixer".

Preferably, in any one of the first through tenth mixers, the current-to-voltage converter may be provided with a resistor.

Preferably, in any one of the first through tenth mixers, the current-to-voltage converter may be provided with an inductor.

Preferably, in any one of the first through tenth mixers, the current-to-voltage converter may be provided with an inductor and a capacitor connected in parallel to each other.

A quadrature modulator according to the present invention includes a pair of mixers, an adder for adding up output currents of the mixers, and a current-to-voltage converter for converting an output current of the adder into a voltage. Each of the mixers has a voltage-to-current converter for converting an input voltage into a current, a current amplifier for amplifying the current converted by the voltage-to-current converter, a controller for controlling an amplification factor of the current amplifier in accordance with a gain control signal, and a mixing unit for converting a frequency of the current amplified by the current amplifier, in accordance with a conversion gain control signal.

A variable gain amplifier according to the present invention includes a voltage-to-current converter for converting an input voltage into a current, a current amplifier for amplifying the current, a current-to-voltage converter for converting the current amplified by the current amplifier into a voltage, and a controller for controlling an amplification factor of the current amplifier in accordance with a gain control signal. Therefore, the variable gain amplifier can satisfy the three features of low dissipation power, low distortion, and gain continuity simultaneously.

A mixer according to the present invention includes a voltage-to-current converter for converting an input voltage into a current, a current amplifier for amplifying the current converted by the voltage-to-current converter, a controller for controlling an amplification factor of the current amplifier in accordance with a gain control signal externally inputted, a mixing unit for converting a frequency of the current amplified by the current amplifier, and a current-to-voltage converter for converting the current with its frequency converted by the mixing unit into a voltage. Therefore, the mixer can satisfy the three features of low dissipation power, low distortion, and gain continuity simultaneously.

A quadrature modulator according to the present invention includes a pair of mixers, an addition section for adding up output currents of the mixers, and a current-to-voltage converter for converting an output current of the addition section into a voltage, wherein each mixer has a voltage-to-current converter for converting an input voltage into a current, a current amplifier for amplifying the current converted by the voltage-to-current converter, a controller for controlling an amplification factor of the current amplifier in accordance with a gain control signal, and a mixing unit for converting a frequency of the current amplified by the current amplifier, in accordance with a gain control signal. Therefore, the quadrature modulator can satisfy the three features of low dissipation power, low distortion, and gain continuity simultaneously.

DESCRIPTION OF THE PREFERRED EMBODIMENTS

The following will describe embodiments of the present invention with reference to the drawings.

First Embodiment

Figure 1:
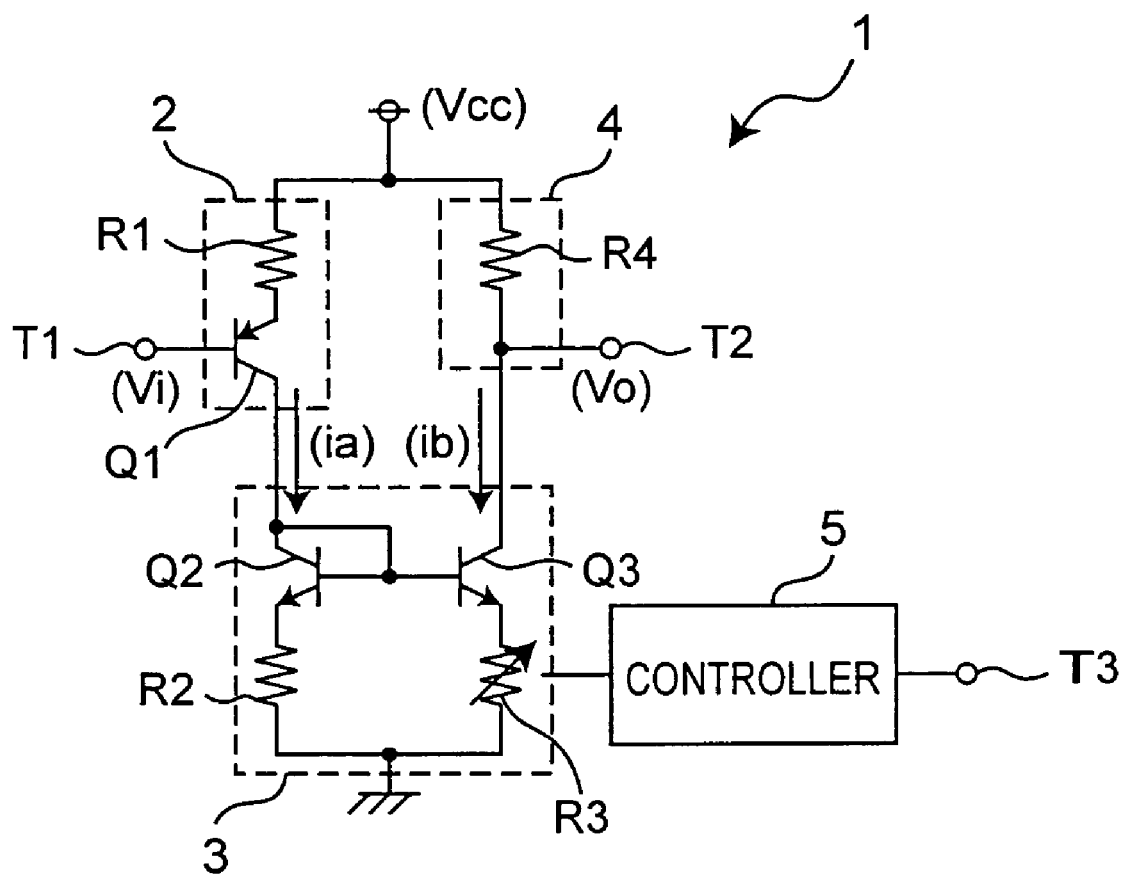
FIG. 1 is a circuit diagram showing a configuration example of a variable gain amplifier according to a first embodiment of the present invention.

FIG. 1 is a circuit diagram showing a configuration example of a variable gain amplifier according to the first embodiment of the present invention. This variable gain amplifier amplifies an input voltage at a variable gain and outputs the resultant voltage. As shown in FIG. 1, the variable gain amplifier 1 includes a voltage-to-current converter 2, a current amplifier 3, a current-to-voltage converter 4, and a controller 5. The voltage-to-current converter 2 converts an input voltage into a current. The current amplifier 3 amplifies the current converted by the voltage-to-current converter 2. The current-to-voltage converter 4 converts the current amplified by the current amplifier 3 into a voltage. The controller 5 changes an amplification factor of the current amplifier 3 in accordance with a gain control signal inputted from an outside.

The following describes in more detail the configuration of the variable gain amplifier 1. The voltage-to-current converter 2 includes a resistor R1 connected to a power source voltage $V_{cc}$, and a PNP transistor Q1 connected in series to the resistor R1. The current amplifier 3 includes a pair of NPN transistors Q2 and Q3 that constitute a current mirror circuit and resistors R2 and R3 connected in series to the NPN transistors Q2 and Q3, respectively. In this arrangement, the NPN transistor Q2 is connected in series to the PNP transistor Q1, and collectors of the PNP transistor Q1 and the NPN transistor Q2 are connected to each other, and the resistor R3 is a variable resistor. The current-to-voltage converter 4 includes a resistor R4 whose one terminal is connected to the power source voltage $V_{cc}$. The other terminal of the resistor R4 is connected to a collector of the NPN transistor Q3. The controller 5 changes a resistance of the variable resistor R3 in accordance with a gain control signal inputted from an outside.

The following describes an operation of the variable gain amplifier 1. An input terminal T1 is connected to a gate of the NPN transistor Q1 in the voltage-to-current converter 2. When a voltage $V_i$ is applied to the input terminal T1, a current $i_a$ flows through the PNP transistor Q1. In this arrangement, a conversion factor gm of the voltage-to-current converter 2 is given by a following Equation (1) using a resistance $r_1$ of the resistor R1:

$$gm = \Delta i_a / \Delta V_i = 1/r_1 \quad (1)$$

Since the PNP transistor Q1 and the NPN transistor Q2 are connected in series to each other, the current $i_a$ also flows through the NPN transistor Q2. When the current $i_a$ flows through the NPN transistor Q2, a current $i_b$ flows also through the NPN transistor Q3 according to characteristics of the current mirror circuit. In this case, supposing that base-emitter voltages of the NPN transistors Q2 and Q3 are $V_{BE2}$ and $V_{BE3}$ respectively and resistances of the resistors R2 and R3 are $r_2$ and $r_3$ respectively, the following Equation (2) is established:

$$r_2 \times i_a + V_{BE2} = r_3 \times i_b + V_{BE3} \quad (2)$$

By differentiating both sides of Equation (2) with $i_a$, the following Equation (3) is established:

$$r_2 + \Delta V_{BE2}/\Delta i_a = r_3 \times \Delta i_b/\Delta i_a + \Delta V_{BE3}/\Delta i_a \quad (3)$$

In this case, if a current amplification factor of the current amplifier 3 is supposed to be $G1 = \Delta i_b / \Delta i_a$, the following Equation (4) is established:

$$G1 = \{r_2 + \Delta V_{BE2}/\Delta i_a - \Delta V_{BE3}/\Delta i_a\}/r_3 \quad (4)$$

Since $r_2 \gg \Delta V_{BE2}/\Delta i_a - \Delta V_{BE3}/\Delta i_a$, the following Equation (5) is established:

$$G1 = r_2/r_3 \quad (5)$$

Further, the current $i_b$ also flows through the resistor R4 in the current-to-voltage converter 4. An output terminal T2 is connected to the resistor R4, and a voltage $V_o$ proportional to the current $i_b$ is outputted from the terminal T2. If a value of the power source voltage is supposed to be $V_{cc}$ and a resistance of the resistor R4 is supposed to be $R_{4o}$, the voltage $V_o$ is given as $V_o = V_{cc} - R_{4o} \times i_b$, so that a gain of the variable gain amplifier $G_v = \Delta V_o / \Delta V_i$ is given by the following Equation (6):

$$\begin{aligned} G_v &= \Delta(V_{cc} - R_{4o} \times G1 \times i_a)/\Delta V_i \quad (6) \\ &= -R_{4o} \times G1 \times (\Delta i_a / \Delta V_i) \\ &= -R_{4o} \times G1 \times gm \\ &= -(R_{4o}/r_1) \times (r_2/r_3) \end{aligned}$$

It is noted here that only the resistance $r_3$ is variable and the resistances $r_1$, $r_2$, and $R_{4o}$ are constant. Therefore, it can be known that by changing the resistance $r_3$ continuously, it is possible to continuously control the gain $G_v$ of the variable gain amplifier 1. This can be realized in a manner such that the controller 5 continuously changes the resistance $r_3$ of the resistor R3 in accordance with the continuously changing gain control signal inputted to a terminal T3.

Further, it can be known that in the variable gain amplifier 1 shown in FIG. 1, if the gain $G_v$ is high, the resistance $r_3$ is small and so the current $i_b$ is large, and if the gain $G_v$ is low, the resistance $r_3$ is large and so the current $i_b$ is small. That is, according to the variable gain amplifier 1 shown in FIG. 1, if the gain is low and an output level is low, a feature of low dissipation power can be satisfied. Further, the variable gain amplifier 1 can satisfy a feature of low distortion because its saturation input level does not change even if the gain $G_v$ changes.

In the variable gain amplifier 1 shown in FIG. 1, although the voltage-to-current converter 2 is constituted of the resistor R1 and the PNP transistor Q1, the present invention is not limited to this. However, preferably the voltage-to-current converter 2 may be configured so as to have a constant conversion rate at which a voltage is converted into a current.

Second Embodiment

Figure 2:
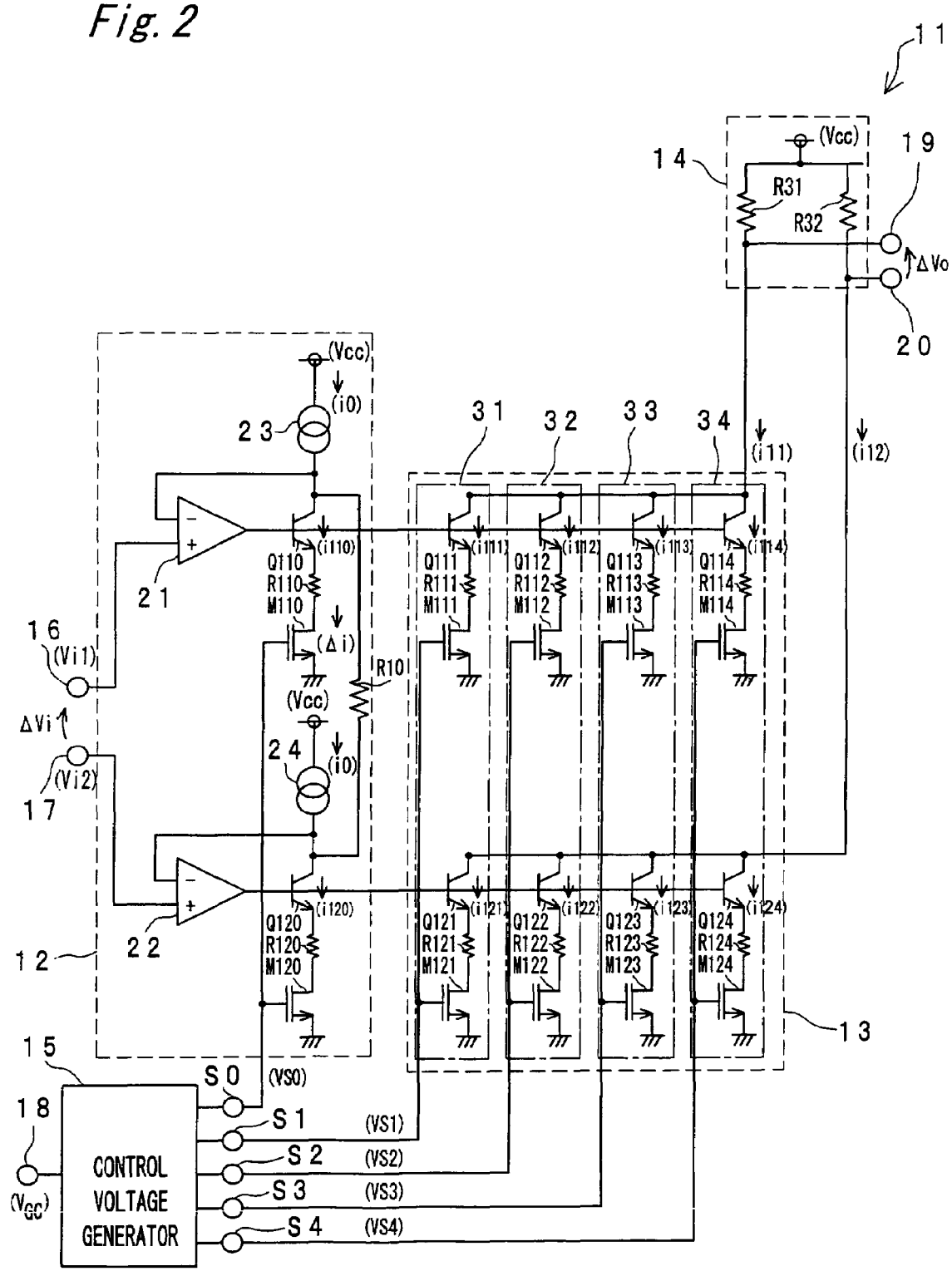
FIG. 2 is a circuit diagram showing a configuration example of a variable gain amplifier according to a second embodiment of the present invention.

FIG. 2 is a circuit diagram showing a configuration example of a variable gain amplifier according to the second embodiment of the present invention. As shown in FIG. 2, a variable gain amplifier 11 according to the second embodiment includes a voltage-to-current converter 12, a current amplifier 13, a current-to-voltage converter 14, and a control voltage generator 15. The voltage-to-current converter 12 includes two input terminals 16 and 17 to which input signals are inputted respectively from an outside, and the control voltage generator 15 includes one input terminal 18 to which a gain control signal is inputted from an outside. The current-to-voltage converter 14 converts currents outputted from the current amplifier 13 into voltages and generates the resultant voltages through two output terminals 19 and 20 thereof, respectively. In this arrangement, the control voltage generator 15 constitutes a controller. This variable gain amplifier 11 amplifies the voltages inputted to the input terminals 16 and 17, at the respective variable gains, and outputs them from the corresponding output terminals 19 and 20. That is, the variable gain amplifier 11 shown in FIG. 2 is configured to combine two variable gain amplifiers 1 shown in FIG. 1.

The voltage-to-current converter 12 includes operational amplifiers 21 and 22, constant current sources 23 and 24, NPN transistors Q110 and Q120, resistors R10, R110, and R120, and N type metal-oxide-semiconductor transistors (hereinafter referred to as "N type MOS transistors") M110 and M120. The current amplifier 13 includes four current amplification circuits 31, 32, 33, and 34. The current amplification circuit 31 includes NPN transistors Q111 and Q121, resistors R111 and R121, and N type MOS transistors M111 and M121, and the current amplification circuit 32 includes NPN transistors Q112 and Q122, resistors R112 and R122, and N type MOS transistors M112 and M122. Further, the current amplification circuit 33 includes NPN transistors Q113 and Q123, resistors R113 and R123, and N type MOS transistors M113 and M123, and the current amplification circuit 34 includes NPN transistors Q114 and Q124, resistors R114 and R124, and N type MOS transistors M114 and M124. The current-to-voltage converter 14 includes a pair of resistors R31 and R32 connected to a power source voltage $V_{cc}$.

To simplify description, in the following, it is supposed that the NPN transistors Q110 to Q114 and Q120 to Q124 have the same size and the same properties and the resistors R110 to R114 and R120 to R124 have the same resistance. Further, it is supposed that the N type MOS transistors M110 to M114 and M120 to M124 have the same size and properties and the resistors R31 and R32 have the same resistance.

The control voltage generator 15 includes five output terminals S0-S4. The output terminal S0 is connected to each of gates of the N type MOS transistors M110 and M120 in the voltage-to-current converter 12, and the output terminal S1 is connected to each of gates of the N type MOS transistors M111 and M121 in the current amplification circuit 31. Further, the output terminal S2 is connected to each of gates of the N type MOS transistors M112 and M122 in the current amplification circuit 32, the output terminal S3 is connected to each of gates of the N type MOS transistors M113 and M123 in the current amplification circuit 33, and the output terminal S4 is connected to each of gates of the N type MOS transistors M114 and M124 in the current amplification circuit 34. When a gain control voltage $V_{GC}$ serving as is a gain control signal is inputted to the input terminal 18 from the outside, the control voltage generator 15 generates voltages in accordance with the gain control voltage $V_{GC}$ at the output terminals S0-S4, respectively.

Figure 3:
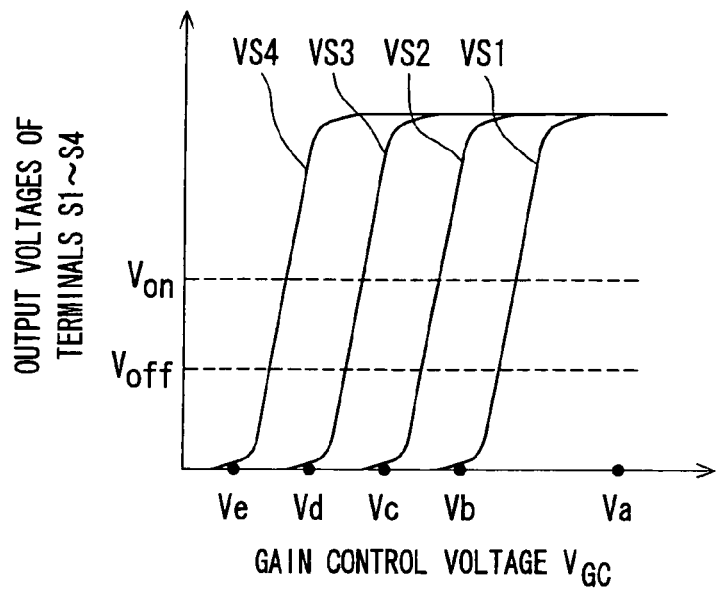
FIG. 3 is a graph showing a relationship between an input gain control voltage $V_{GC}$ and voltages generated at output terminals S1-S4.

FIG. 3 is a graph showing a relationship between the input gain control voltage $V_{GC}$ and the voltages generated at the output terminals S1-S4. It is supposed here that voltages at which the N type MOS transistors M110-M114 and M120-M124 are turned on and off are, respectively, $V_{on}$ and $V_{off}$. As shown in FIG. 3, if the gain control voltage $V_{GC}$ exceeds a predetermined voltage $V_b$, a voltage $V_{S1}$ that appears at the output terminal S1 rapidly increases to exceed the voltage $V_{on}$. Similarly, if the gain control voltage $V_{GC}$ exceeds predetermined voltages $V_c$, $V_d$, and $V_e$, corresponding voltages $V_{S2}$ to $V_{S4}$ that appear at the respective output terminals S2 to S4 also increase rapidly to exceed the voltage $V_{on}$. It is to be noted that the values $V_b$, $V_c$, $V_d$, and $V_e$ of the voltage $V_{GC}$ at which the voltages appearing at the respective output terminals S1-S4 change rapidly are set to be different for each of the output terminals S1, S2, S3, and S4. Further, a voltage $V_{S0}$ that appears at the output terminal S0 is set to be always larger than the voltage $V_{on}$ irrespective of a value of the gain control voltage $V_{GC}$.

Figure 4:
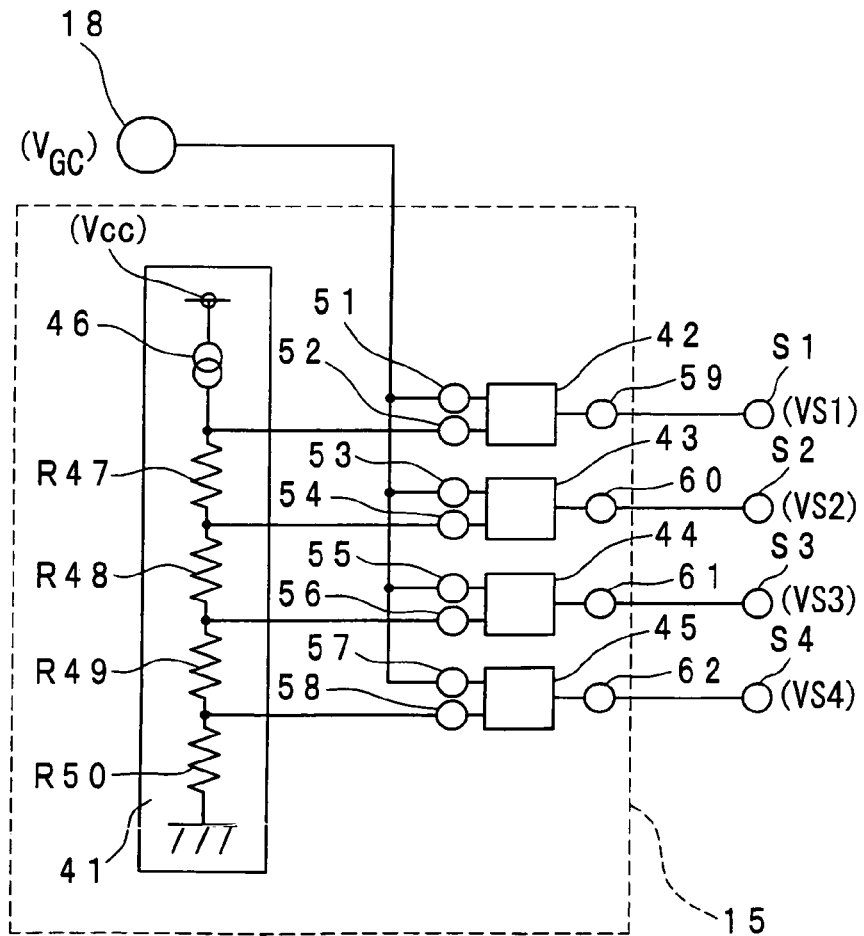
FIG. 4 is a circuit diagram showing a configuration example of a control voltage generator 15.

FIG. 4 is a circuit diagram showing a configuration example of the control voltage generator 15. As shown in FIG. 4, the control voltage generator 15 includes a reference voltage generation circuit 41 and four voltage comparison circuits 42-45. The reference voltage generation circuit 41 has a configuration in which a current source 46 and four resistors R47 to R50 are connected in series between a power source voltage $V_{cc}$ and a ground voltage. The voltage comparison circuit 42 compares a voltage of a node between the resistor R47 and the current source 46 and the gain control voltage $V_{GC}$ inputted through the input terminal 18 and outputs the voltage $V_{S1}$ based on a result of the comparison. The voltage comparison circuit 43 compares a voltage of a node between the resistors R47 and R48 and the gain control voltage $V_{GC}$ and outputs the voltage $V_{S2}$ based on a result of the comparison. The voltage comparison circuit 44 compares a voltage of a node between the resistors R48 and R49 and the gain control voltage $V_{GC}$ and outputs the voltage $V_{S3}$ based on a result of the comparison. The voltage comparison circuit 45 compares a voltage of a node between the resistors R49 and R50 and the gain control voltage $V_{GC}$ and outputs the voltage $V_{S4}$ based on a result of the comparison. In this configuration, the reference voltage generation circuit 41 constitutes a constant voltage generator and each of the voltage comparison circuits 42-45 constitutes a control voltage generation section. For simplicity, it is assumed in the following description that the resistors R47-R50 have the same resistance and the voltage comparison circuits 42-45 have the same configuration.

Figure 5:
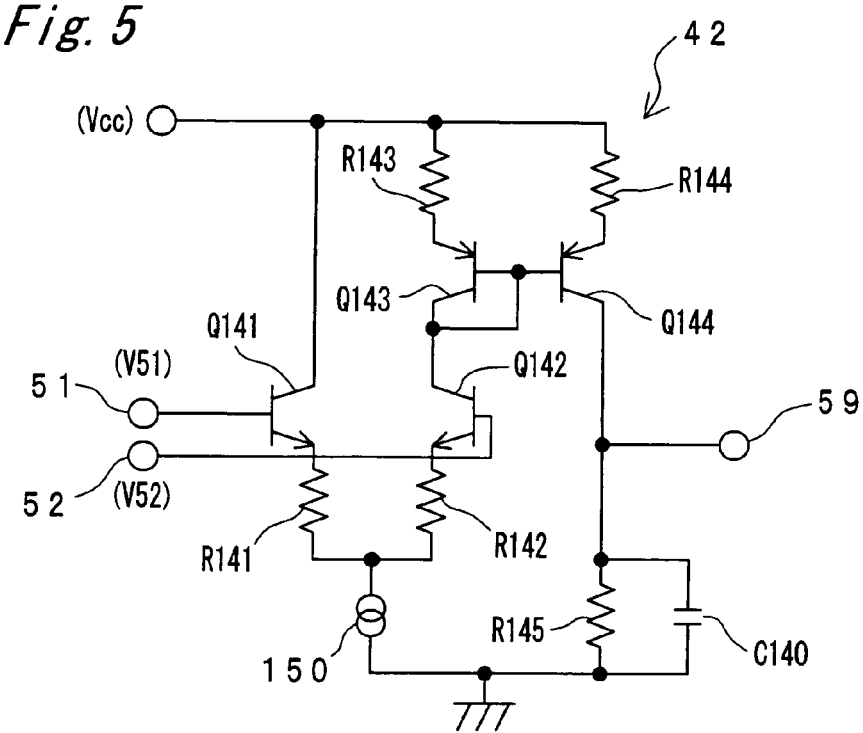
FIG. 5 is a circuit diagram showing a configuration example of a voltage comparison circuit 42.

FIG. 5 is a circuit diagram showing a configuration example of the voltage comparison circuit 42. As shown in FIG. 5, the voltage comparison circuit 42 includes two input terminals 51 and 52, one output terminal 59, a pair of NPN transistors Q141 and Q142, a pair of PNP transistors Q143 and Q144, resistors R141-R145 and a capacitor C140. In this configuration, the NPN transistors Q141 and Q142 and the resistors R141 and 142 constitute a differential amplification circuit and the PNP transistors Q143 and Q144 and the resistors R143 and R144 constitute a current mirror circuit. In this arrangement, the PNP transistor Q143 and the resistor R143 in the current mirror circuit constitute a load of the NPN transistor Q142 which is one of the differential pair of the differential amplification circuit. The resistor R145 constitutes a voltage output section, which converts an output current of the current mirror circuit into a voltage to be outputted. A voltage that appears at the output terminal 59 can be adjusted by adjusting a current from a current source 150, a resistance of the resistor R145, and a rate of an output current with respect to an input current for the current mirror circuit. The capacitor C140 connected to the output terminal 59 is provided to attenuate a noise that appears at the output terminal 59.

Figure 6A:
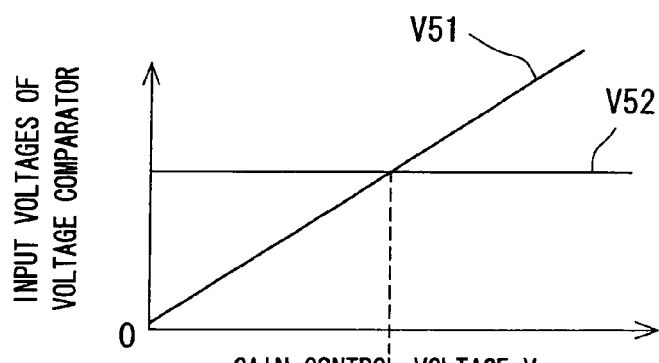
FIG. 6A is a graph showing a relationship between the gain control voltage $V_{GC}$ and voltages $V_{S1}$ and $V_{S2}$ to the corresponding input terminals 51 and 52, respectively.
Figure 6B:
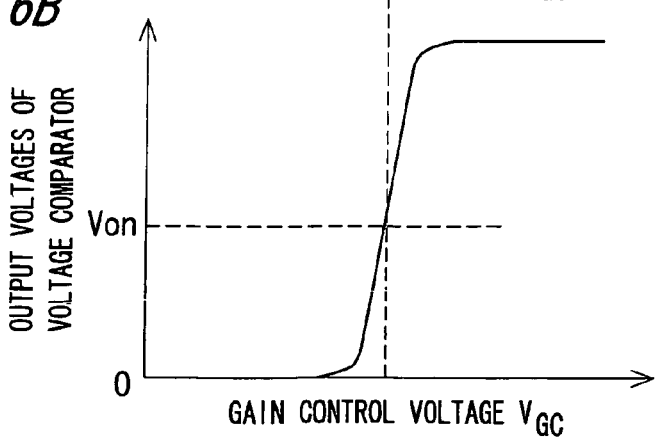
FIG. 6B is a graph showing a relationship between the gain control voltage $G_{GC}$ and a voltage output to an output terminal 59.

The following describes an operation of the voltage comparison circuit 42. FIG. 6A is a graph showing a relationship between the gain control voltage $V_{GC}$ and voltages $V_{51}$ and $V_{52}$ inputted to the corresponding input terminals 51 and 52, respectively. FIG. 6B is a graph showing a relationship between the gain control voltage $G_{GC}$ and a voltage outputted to the output terminal 59. As shown in FIG. 6A, the voltage comparison circuit 42 is supplied with a constant voltage at its input terminal 52 from the reference voltage generation circuit 41, and is supplied with the gain control voltage $V_{GC}$ at its input terminal 51. When such voltages $V_{51}$ and $V_{52}$ as shown in FIG. 6A are inputted to the corresponding input terminals 51 and 52, a voltage such as shown in FIG. 6b appears at the output terminal 59. In the voltage comparison circuit 42 shown in FIG. 5, if the two input voltages $V_{51}$ and $V_{52}$ are equal to each other, the same current flows through the NPN transistors Q141 and Q142. A current flowing through the PNP transistor Q143 is equal to that flowing through NPN transistor Q142. Further, according to properties of the current mirror circuit, a current flowing through the PNP transistor Q144 is proportional to that flowing through the PNP transistor Q143. A current flowing through the PNP transistor Q144 flows through the resistor R145. In this case, preferably a voltage that appears at the output terminal 59 is adjusted to a threshold value at which N type MOS transistors M111 and M121 are turned on. As shown in FIG. 6B, supposing this threshold voltage to be $V_{on}$, if the input voltage $V_{51}$ is larger than the input voltage $V_{52}$, the voltage at the output terminal 59 is larger than $V_{on}$, and if the input voltage $V_{52}$ is larger than the input voltage $V_{51}$, the voltage at the output terminal 59 is smaller than $V_{on}$. This holds true also with the voltage comparison circuits 43 to 45. In such a manner, the voltage comparison circuits 42 to 45 can be configured relatively easily.

The following describes an operation of the variable gain amplifier 11 shown in FIG. 2. To simplify the following description, it is supposed that, as for values $V_b$, $V_c$, $V_d$, $V_e$ (see FIG. 3) of the gain control voltage $V_{GC}$, voltage differences $V_b-V_c$, $V_c-V_d$, and $V_d-V_e$ are equal to each other. First, it is supposed that the gain control voltage $V_{GC}$ is sufficiently large and the voltages that appear at the output terminals S1, S2, S3, and S4 of the control voltage generation circuit 15 respectively are larger than $V_{on}$. As described above, the gates of the N type MOS transistors M110-M114 and M120-M124 are connected to the control terminals S0-S4 respectively and the voltages larger than $V_{on}$ are generated at the control terminals S0-S4, so that the N type MOS transistors M110-M114 and M120-M124 are all in the on-state. It is to be noted that the N type MOS transistors M110 and M120 are inserted in consideration of fluctuations in turn-on resistances of the N type MOS transistors M111-M114 and M121-M124.

In a case where the N type MOS transistors M110-M114 and M120-M124 are in the on-state as described above, if voltages $V_{i1}$ and $V_{i2}$ are inputted to the input terminals 16 and 17 of the voltage-to-current converter 12 respectively, the voltage $V_{i1}$ is inputted to a non-inverting input terminal (+) of the operational amplifier 21, and an output voltage of the operational amplifier 21 is inputted to a base of the NPN transistor Q110. A collector of the NPN transistor Q110 is connected in common to the constant current source 23 and the resistor R10. Further, a collector voltage of the NPN transistor Q110 is fed back to an inverting input terminal (−) of the operational amplifier 21. An emitter of the NPN transistor Q110 is grounded via the resistor R110 and the N type MOS transistor M110, thereby constituting a grounded-emitter amplifier. The collector voltage of the NPN transistor Q110, which is an output voltage of this grounded-emitter amplifier, is exposed to feedback control by the operational amplifier 21 so as to be equal to the voltage $V_{i1}$ inputted to the input terminal 16.

On the other hand, the voltage $V_{i2}$ is inputted to the non-inverting input terminal (+) of the operational amplifier 22, and an output voltage of the operational amplifier 22 is inputted to a base of the NPN transistor Q120. A collector of the NPN transistor Q120 is connected in common to the constant current source 24 and the resistor R10. Further, a collector voltage of the NPN transistor Q120 is fed back to an inverting input terminal (−) of the operational amplifier 22. An emitter of the NPN transistor Q120 is grounded via the resistor R120 and the N type MOS transistor M120, thereby constituting a grounded-emitter amplifier. The collector voltage of the NPN transistor Q120, which is an output voltage of this grounded-emitter amplifier, is exposed to feedback control by the operational amplifier 22 so as to be equal to the voltage $V_{i2}$ inputted to the input terminal 17.

If it is supposed that $\Delta V_i = V_{i1} - V_{i2}$ and that a resistance of the resistor R10 is $r_{10}$, a current $\Delta i$ flowing through the resistor R10 is given by the following Equation (7):

$$\Delta i = (V_{i1} - V_{i2})/r_{10} = \Delta V_i/r_{10} \tag{7}$$

Further, if output currents from the constant current sources 23 and 24 are both supposed to be $i_0$, a current $i_{110}$ flowing through the NPN transistor Q110 and a current $i_{120}$ flowing through the NPN transistor Q120 are given by the following Equations (8) and (9) respectively:

$$i_{110} = i_0 - \Delta i = i_0 - \Delta V_i/r_{10} \tag{8}$$

$$i_{120} = i_0 + \Delta i = i_0 + \Delta V_i/r_{10} \tag{9}$$

In this case, relationships of $i_{110} > 0$ and $i_{120} > 0$ are established, $\Delta i$ changes in a range of $-i_0$ through $+i_0$ in accordance with $\Delta V_i$. A voltage of $\Delta V_i$ required for changing $\Delta i$ in the range of $-i_0$ through $+i_0$ is $r_{10} \times i_0$. Conversely, even if a larger voltage of $\Delta V_i$ is inputted, $\Delta i$ cannot follow a changing value of $\Delta V_i$. Therefore, the voltage of $r_{10} \times i_0$ provides a saturation input level of the variable gain amplifier 11.

Next, referring to the NPN transistor Q111, the resistor R111, and the MOS transistor M111 in the current amplification circuit 31 of the current amplifier 13, in a similar manner to the NPN transistor Q110, the resistor R110, and the MOS transistor M110, these elements constitute a grounded-emitter amplifier in such a configuration that the NPN transistor Q110 and the NPN transistor Q111 share the same base. Therefore, a current $i_{111}$ is equal to a current $i_{110}$ flowing through the NPN transistor Q110. Similarly, currents $i_{112}$, $i_{113}$, and $i_{114}$ flowing through the corresponding NPN transistors Q112, Q113, and Q114 are all equal to the current $i_{110}$ flowing through the NPN transistor Q110. Similarly, currents $i_{121}$, $i_{122}$, $i_{123}$, and $i_{124}$ flowing through the corresponding NPN transistors Q121, Q122, Q123, and Q124 are all equal to the current $i_{120}$ flowing through the NPN transistor Q120.

Further, the currents $i_{11}$ and $i_{12}$ flowing through the resistors R31 and R32 in the current-to-voltage converter 14 are given by the following Equations (10) and (11) respectively:

$$i_{11} = i_{111} + i_{112} + i_{113} + i_{114} = 4 \times i_{110} = 4 \times (i_0 - \Delta V_i/r_{10}) \tag{10}$$

$$i_{12} = i_{121} + i_{122} + i_{123} + i_{124} = 4 \times i_{120} = 4 \times (i_0 + \Delta V_i/r_{10}) \tag{11}$$

In this case, if resistances of the resistors R31 and R32 are both supposed to be $r_{30}$, an output signal of the voltage difference $\Delta V_o$ outputted from the output terminals 19 and 20 of the current-to-voltage converter 14 are given by the following Equation (12):

$$\Delta V_o = (V_{cc} - r_{30} \times i_{11}) - (V_{cc} - r_{30} \times i_{12}) = r_{30} \times (i_{12} - i_{11}) - 4 \times r_{30} \times \{(i_0 + \Delta V_i/r_{10}) - (i_0 - \Delta V_i/r_{10})\} = 4 \times 2 \times r_{30} \times \Delta V_i/r_{10} \tag{12}$$

That is, a gain $G_v$ of the variable gain amplifier 11 in this condition is given as follows:

$$G_V = 4 \times 2 \times r_{30}/r_{10} = 4 \times G_0 \tag{13}$$

Here $G_0 = 2 \times r_{30}/r_{10}$.

Then, if the gain control voltage $V_{GC}$ applied to the input terminal 18 decreases to a level of the voltage $V_b$ as shown in FIG. 3, the voltage $V_{S1}$ that appears at the control terminal S1 decreases to 0 V. Accordingly, the N type MOS transistors M111 and M121 are turned off. On the other hand, the N type MOS transistors M112-M114 and M122-M124 remain in the on-state because the voltages at the control terminals S2, S3, and S4 are larger than $V_{on}$. In this case, since the N type MOS transistors M111 and M121 are turned off and a relationship of $i_{111} = i_{121} = 0$ is established, the currents $i_{11}$ and $i_{12}$ flowing through the resistors R31 and R32 in the current-to-voltage converter 14 are given by the following Equations (14) and (15), respectively:

$$i_{11} = i_{112} + i_{113} + i_{114} = 3 \times i_{110} = 3 \times (i_0 - \Delta V_i/r_{10}) \tag{14}$$

$$i_{12} = i_{122} + i_{123} + i_{124} = 3 \times i_{120} = 3 \times (i_0 + \Delta V_i/r_{10}) \tag{15}$$

That is, the gain $G_V$ of the variable gain amplifier 11 in this condition is given by:

$$G_V = 3 \times 2 \times r_{30}/r_{10} = 3 \times G_0 \tag{16}$$

Similarly, if the gain control voltage $V_{GC}$ applied to the input terminal 18 decreases to a level of the voltage $V_c$ as shown in FIG. 3, the N type MOS transistors M112 and M122 are turned off, so that the gain $G_v$ of the variable gain amplifier 11 is given by:

$$G_V = 2 \times G_0 \tag{17}$$

If the gain control voltage $V_{GC}$ applied to the input terminal 18 decreases to a level of the voltage $V_d$ as shown in FIG. 3, the N type MOS transistors M113 and M123 are turned off, so that the gain $G_v$ of the variable gain amplifier 11 is given by:

$$G_V = 1 \times G_0 \tag{18}$$

If the gain control voltage $V_{GC}$ applied to the input terminal 18 decreases to a level of the voltage $V_e$ as shown in FIG. 3, the N type MOS transistors M114 and M124 are turned off, so that the gain $G_v$ of the variable gain amplifier 11 is given by:

$$G_V = 0 \times G_0 \tag{19}$$

As can be seen from the above, in the variable gain amplifier 11, as the gain control voltage $V_{GC}$ changes, the gain $G_v$ changes to $4G_0$, $3G_0$, $2G_0$, $G_0$, and 0 in this order.

The following describes a case where the gain control voltage $V_{GC}$ is between the voltage $V_a$ and the voltage $V_b$ shown in FIG. 3, for example. In this case, at the control terminal S1, a voltage between $V_{on}$ and $V_{off}$ appears, so that the N type MOS transistors M111 and M121 whose gates are connected to the control terminal S1 enter an intermediate state between the on-state and the off-state. In this condition, if it is supposed that turn-on resistances of the N type MOS transistors M111 and M121 are $R_{ON1}$, turn-on resistances of the N type MOS transistors M110 and M120 are $R_{ON0}$, base-emitter voltages of the NPN transistors Q110 and Q120 are $V_{BE0}$, and base-emitter voltages of the NPN transistors Q111 and Q121 are $V_{BE1}$, the following Equation (20) is established:

$$V_{BE0}+(R_{110}+R_{ON0})\times i_{110}=V_{BE1}+(R_{111}+R_{ON1})\times i_{111} \quad (20)$$

Equation (20) may be modified into the following Equation (21):

$$V_{BE0}-V_{BE1}+(R_{110}+R_{ON0})\times i_{110}-(R_{111}+R_{ON1})\times i_{111}=0 \quad (21)$$

Here, given that $R_{110} \gg R_{ON0}$ and $V_{BE0}-V_{BE1} \ll (R_{111}+R_{ON1})\times i_{111}-(R_{110}+R_{ON0})\times i_{110}$, Equation (21) may be modified into:

$$R_{110}\times i_{110}-(R_{111}+R_{ON1})\times i_{111}=0 \quad (22)$$

Since a relationship of $R_{110}=R_{111}$ is established, Equation (22) may be modified into:

$$i_{111}=i_{110}/\{1+(R_{ON1}/R_{111})\} \quad (23)$$

In a case where the gain control voltage $V_{GC}$ is between the voltages $V_a$ and $V_b$, the turn-on resistance $R_{ON1}$ of the N type MOS transistors M111 and M121 connected to the control terminal S1 changes in a range of 0 through ∞ in accordance with a gate-source voltage of the N type MOS transistors M111 and M121 that changes between $V_{off}$ and $V_{on}$. Accordingly, the value of the current $i_{111}$ changes in a range of $i_{110}$ to 0. Further, the following equations (24) and (25) are established:

$$i_{11}=i_{111}+i_{112}+i_{113}+i_{114}=3\times i_{110}+i_{110}/\{1+R_{ON1}/R_{111}\} \quad (24)$$

$$i_{12}=i_{121}+i_{122}+i_{123}+i_{124}=3\times i_{120}+i_{120}/\{1+R_{ON1}/R_{121}\} \quad (25)$$

Thus, the gain $G_v$ is given by the following Equation (26):

$$G_V=3\times G_0+\{1+(R_{ON1}/R_{121})\}\times G_0 \quad (26)$$

As seen from the above, in the variable gain amplifier 11 according to the second embodiment, the gain $G_v$ changes from $4G_0$ to $3G_0$ continuously. Similarly, in cases where the gain control voltage $V_{GC}$ is between the voltage $V_b$ and the voltage $V_c$, between the voltage $V_c$ and the voltage $V_d$, and between the voltage $V_d$ and $V_e$, the gain $G_v$ continuously changes from $3G_0$ to $2G_0$, from $2G_0$ to $G_0$, and from $G_0$ to 0, respectively, so that the gain $G_v$ eventually changes from 0 to $4G_0$ continuously.

Figure 7:
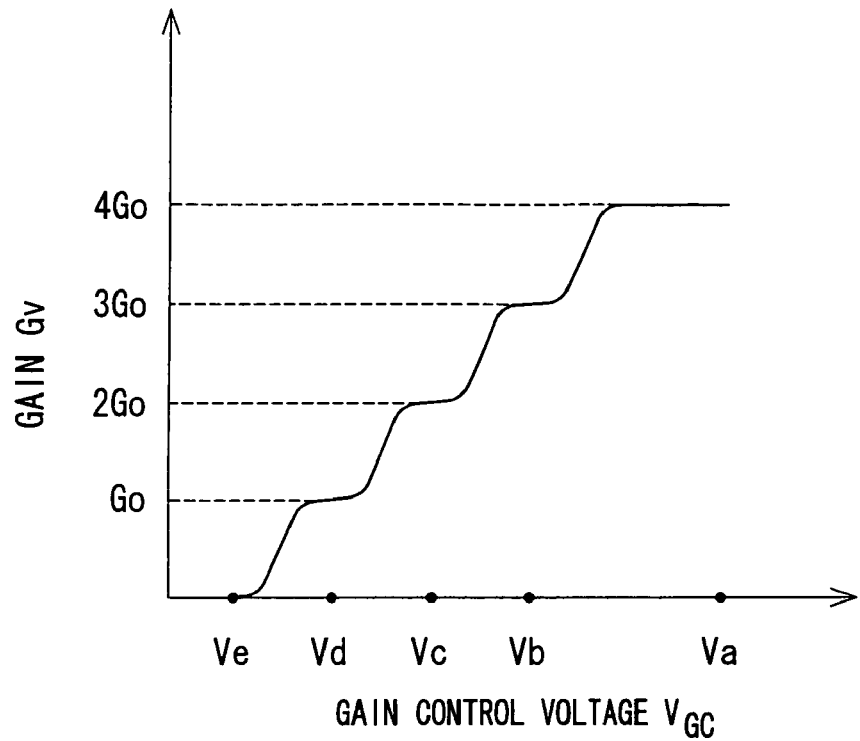
FIG. 7 is a graph showing a relationship between the gain control voltage $G_{GC}$ and a gain $G_v$ for the variable gain amplifier according to the first embodiment.

FIG. 7 is a graph showing a relationship between the gain control voltage $V_{GC}$ and the gain $G_v$ for the variable gain amplifier 11 according to the second embodiment. As shown in FIG. 7, the gain $G_v$ continuously changes from 0 to $4G_0$ as the gain control voltage $V_{GC}$ changes.

Figure 8:
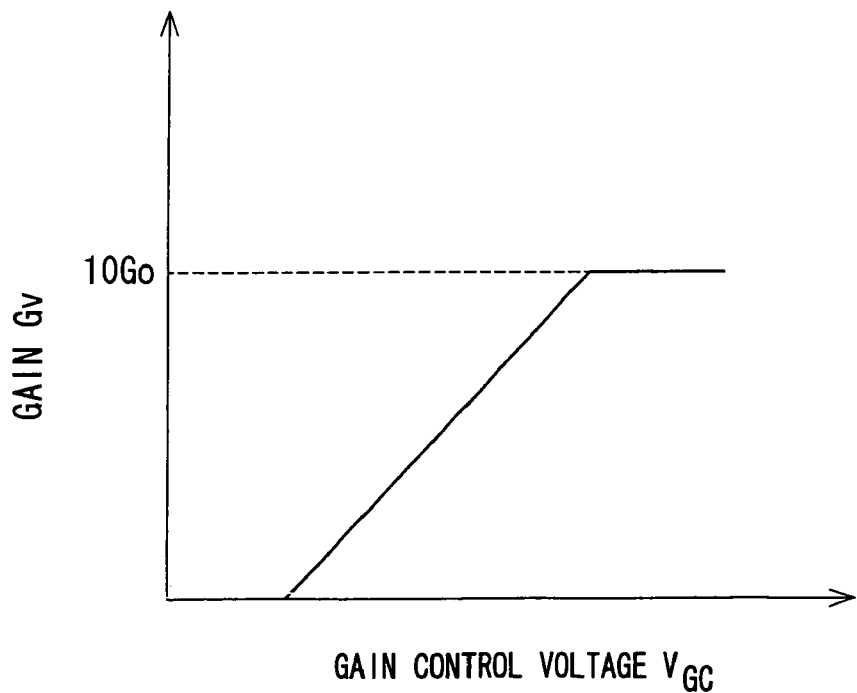
FIG. 8 is a graph showing a relationship between the gain control voltage $G_{GC}$ and the gain $G_v$ in a case where the number of a current amplification circuits is set to 10.

The graph shown in FIG. 7 indicates a poor linearity, that is, a poor linearity of a change in gain $G_v$ with respect to the gain control voltage $V_{GC}$, which poor linearity can be solved by increasing the number of the current amplification circuits of the current amplifier 13. Although the variable gain amplifier 11 shown in FIG. 2 has the four current amplification circuits 31, 32, 33, and 34 in the current amplifier 13, this number can be increased to, for example, 10. Accordingly, also the number of the corresponding control terminals of the control voltage generator 15 can be increased to 10, to improve the gain linearity. FIG. 8 is a graph showing a relationship between the gain control voltage $V_{GC}$ and the gain $G_v$ in a case where the number of the current amplification circuits is increased to 10. As shown in FIG. 8, by increasing the number of the current amplifiers, the linearity of the gain $G_v$ can be improved.

Figure 9:
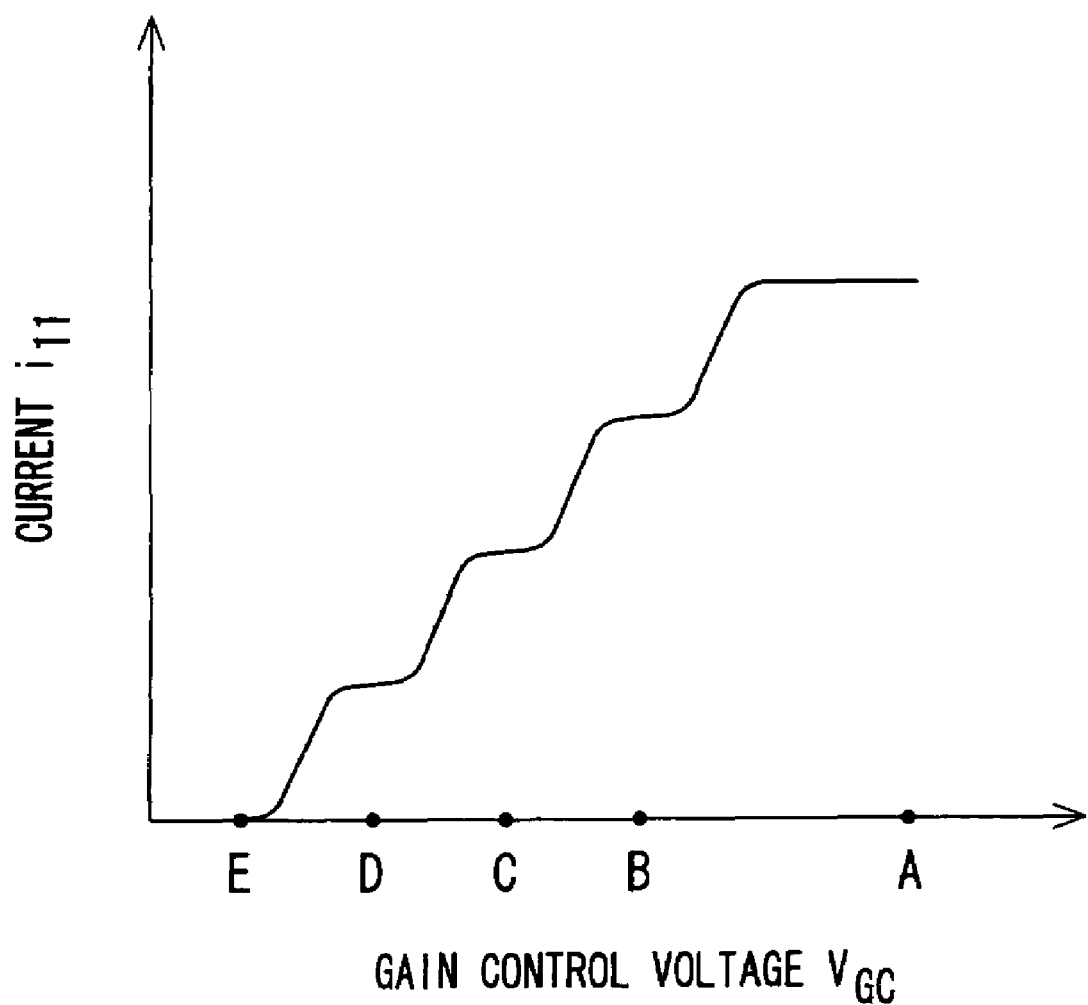
FIG. 9 is a graph showing a relationship between the gain control voltage $V_{GC}$ and a current $i_{11}$.

Furthermore, by changing the gain control voltage $V_{GC}$ continuously, the current $i_{11}$ flowing through the resistor R31 changes continuously. FIG. 9 is a graph showing a relationship between the gain control voltage $V_{GC}$ and the current $i_{11}$.

Comparison between FIGS. 8 and 9 shows that if the gain $G_v$ is high, the current $i_{11}$ is large, and if the gain $G_v$ is low, the current is small. This relationship is similarly established between the gain control voltage $V_{GC}$ and the current $i_{12}$ flowing through the resistor R32. That is, the variable gain amplifier 11 according to the second embodiment can satisfy a feature that dissipation power is low if the gain is low and an output level is low.

Further, the saturation input level, which is $r_{10}\times i_0$, of the variable gain amplifier 11 according to the second embodiment does not change even if the gain changes. That is, the variable gain amplifier 11 according to the second embodiment can satisfy a feature that the saturation input level does not change even if the gain changes.

In the variable gain amplifier 11 according to the present invention, although the current-to-voltage converter 14 is constituted of the resistors R31 and R32, it may be constituted of an inductor and a capacitor. The following describes a difference between the case where the current-to-voltage converter 14 is constituted of a resistor and the case where it is constituted of an inductor. In the case where the current-to-voltage converter 14 is constituted of the resistors R31 and R32, if a resistance of the resistor R31 is assumed to be $r_{30}$, the voltage amplitude $V_{o1}$ at the output terminal 19 is given by the following Equation (27):

$$V_{o1}=V_{cc}-r_{30}\times i_{11} \quad (27)$$

If it is assumed here that, when $\Delta V_i=0$ is established, $i_{11a}$ is $i_{11a}$ and that $V_{o1a}=V_{cc}-r_{30}\times i_{11a}$ and $i_{11}=i_{11a}+\Delta i_{11}$, the following Equation (28) is established:

$$\begin{aligned}V_{o1} &= V_{cc} - r_{30} \times (i_{11a} + \Delta i_{11}) \\ &= V_{cc} - r_{30} \times i_{11a} - r_{30} \times \Delta i_{11} \\ &= V_{o1a} - r_{30} \times \Delta i_{11}\end{aligned} \quad (28)$$

Since $\Delta i_{11}$ fluctuates with $\Delta V_i$, it can be known from Equation (28) that an amplitude of the voltage $V_{o1}$ fluctuates around the voltage $V_{o1a}$.

It is to be noted that a lower limit of the voltage $V_{o1}$ is a voltage Vsat around at which none of the NPN transistors Q110-Q114 is saturated, and its upper limit is the power source voltage $V_{cc}$. That is, if the current-to-voltage converter 14 is constituted of a resistor, a relationship of $V_{sat}<V_{o1}<V_{cc}$ is established. Similarly, a relationship Of $V_{sat}<V_{o2}<V_{cc}$ is established also with the amplitude of the voltage $V_{o2}$ at the output terminal 20.

Figure 10:
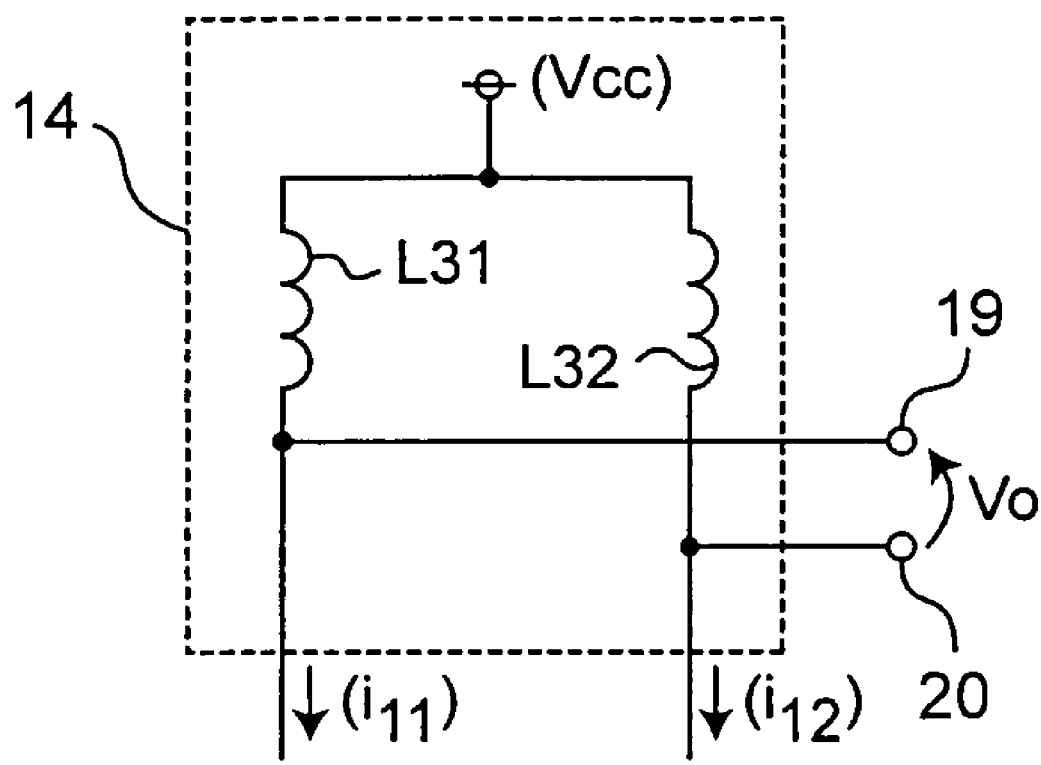
FIG. 10 is a circuit diagram showing a configuration example in the case where a current-to-voltage converter 14 is constituted of an inductor.

Next, the case is discussed where this current-to-voltage converter 14 is constituted of an inductor. FIG. 10 is a circuit diagram showing a configuration example of the case where the current-to-voltage converter 14 is constituted of an inductor. In the current-to-voltage converter 14 shown in FIG. 10, the resistors R31 and R32 in the current-to-voltage converter 14 shown in FIG. 2 are replaced by inductors L31 and L32. If an impedance of the inductor L31 is assumed to be $Z_L=j\times\omega\times L$, an amplitude of the voltage $V_{o1}$ at the output terminal 19 is given by the following Equation (29):

$$\begin{aligned}V_{o1} &= V_{cc} - Z_L \times i_{11} \\ &= V_{cc} - Z_L \times i_{11a} - Z_L \times \Delta i_{11}\end{aligned} \quad (29)$$

Since $i_{11a}$ in this equation is a current component having no frequency fluctuations, $Z_L \times i_{11a} = 0$ is given, and thus the following Equation (30) is established:

$$V_{o1} = V_{cc} - Z_L \times \Delta i_{11} \quad (30)$$

That is, it can be known that the amplitude of the voltage $V_{o1}$ fluctuates around $V_{cc}$. Furthermore, since $Z_L \times \Delta i_{11}$ may take on a negative value in some cases, $V_{o1} > V_{cc}$ is established. Further, similarly, $V_{o2} > V_{cc}$ is established also with the amplitude of the voltage $V_{o2}$ at the output terminal 20.

Figure 11:
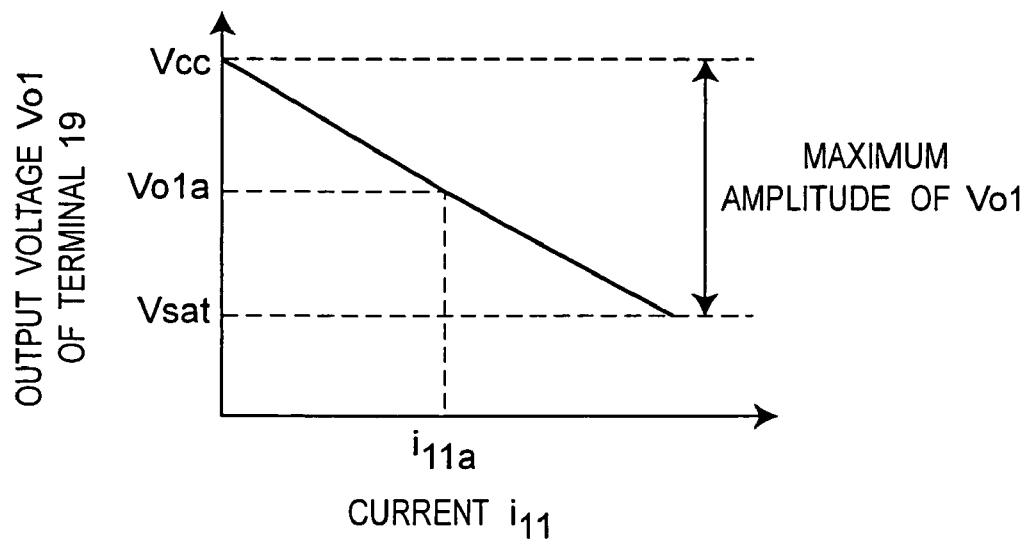
FIG. 11 is a graph showing a relationship between a voltage $V_{o1}$ at an output terminal 19 and a current $i_{11}$ flowing through a resistor R31 in the case where the current-to-voltage converter 14 is constituted of the resistors R31 and R32.
Figure 12:
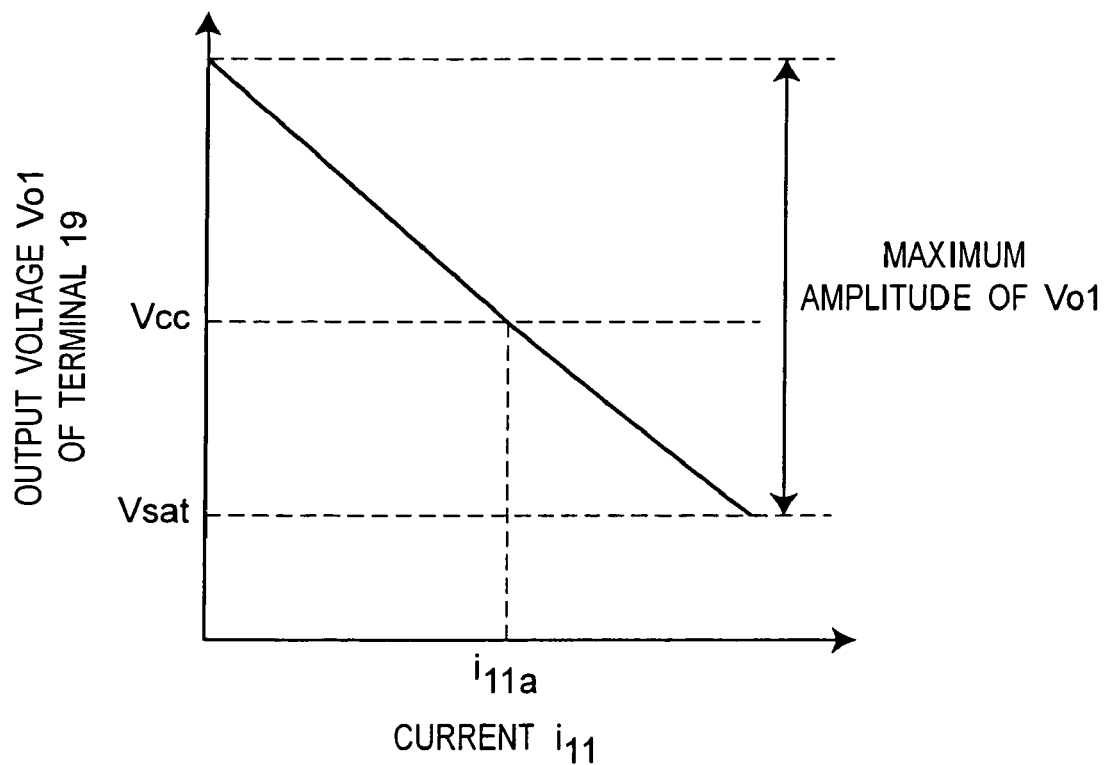
FIG. 12 is a graph showing a relationship between the voltage $V_{o1}$ at the output terminal 19 and the current $i_{11}$ flowing through an inductor L31 in the case where the current-to-voltage converter 14 is constituted of the inductors L31 and L32.

FIGS. 11 and 12 are graphs describing the above-described contents. Specifically, FIG. 11 is a graph showing a relationship between a voltage $V_{o1}$ at the output terminal 19 and the current $i_{11}$ flowing through the resistor R31 in the case where the current-to-voltage converter 14 is constituted of the resistors R31 and R32. FIG. 12 is a graph showing a relationship between the voltage $V_{o1}$ at the output terminal 19 and the current $i_{11}$ flowing through the inductor L31 in the case where the current-to-voltage converter 14 is constituted of the inductors L31 and L32. In these graphs, a vertical axis represents the voltage $V_{o1}$ at the output terminal 19 and a horizontal axis represents the current $i_{11}$. As can be seen from comparison between FIGS. 11 and 12, in the case where the current-to-voltage converter 14 is constituted of an inductance, the voltage $V_{o1}$ at the output terminal 19 has a larger amplitude than that in the case where it is constituted of a resistor, thus resulting in $Z_L > r_{30}$. That is, the gain $G_v$ of the variable gain amplifier 11 can be increased.

Figure 13:
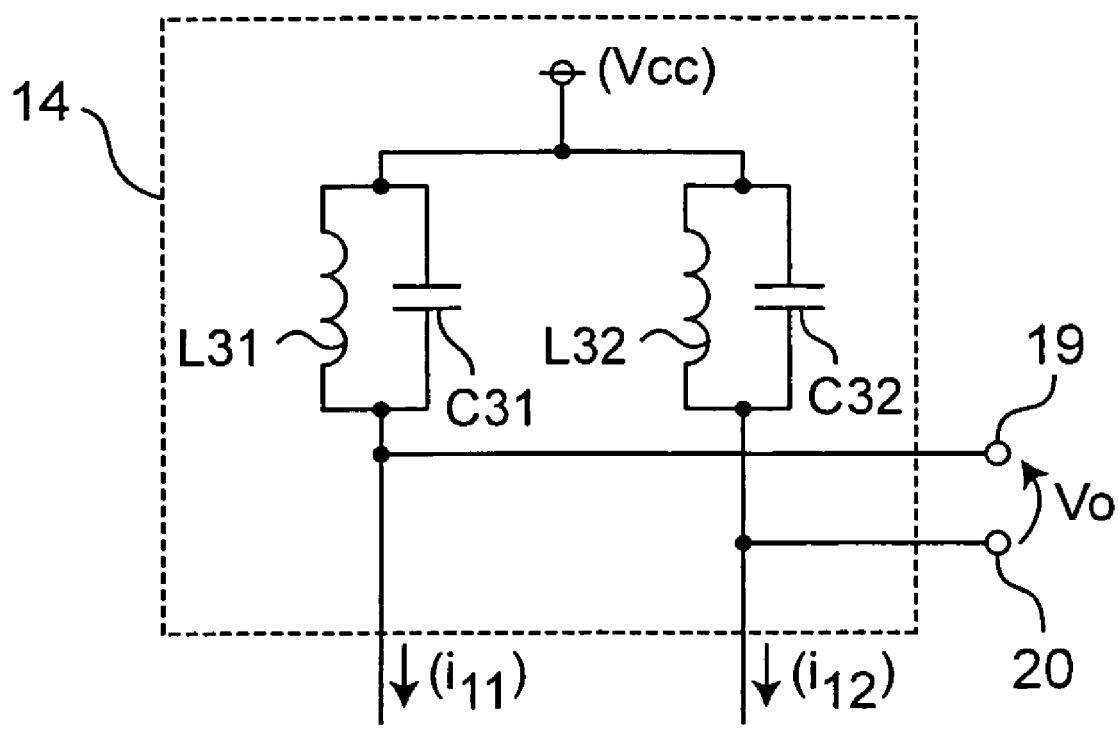
FIG. 13 is a circuit diagram showing a configuration example in the case where the current-to-voltage converter 14 is constituted of an inductor and a capacitor connected in parallel to each other.

Further, the current-to-voltage converter 14 may be constituted of an inductor and a capacitor connected in parallel with each other. FIG. 13 is a circuit diagram showing a configuration example of the current-to-voltage converter 14. In the current-to-voltage converter 14 shown in FIG. 13, the resistor R31 and the resistor R32 in the current-to-voltage converter 14 shown in FIG. 2 are replaced by the inductor L31 and a capacitor C31 connected in parallel with each other and the inductor L32 and a capacitor C32 connected in parallel with each other, respectively. In the case where the current-to-voltage converter 14 is configured as shown in FIG. 13, an impedance $Z_{LC}$ of the parallel connection of the inductor and the capacitor is $Z_{LC} = j \times \omega \times L / (1 - \omega^2 \times L \times C)$. Therefore, this impedance $Z_{LC}$ takes on a very large value if $\omega$ approaches a value of a square root of L×C, that is, it is in the vicinity of $\omega = \sqrt{(L \times C)}$. Accordingly, if the current-to-voltage converter 14 is constituted of a combination of an inductor and a capacitor, the gain $G_v$ of the variable gain amplifier 11 can be increased more than that in a case where it is constituted of a standalone resistor or a standalone inductor.

Figure 14:
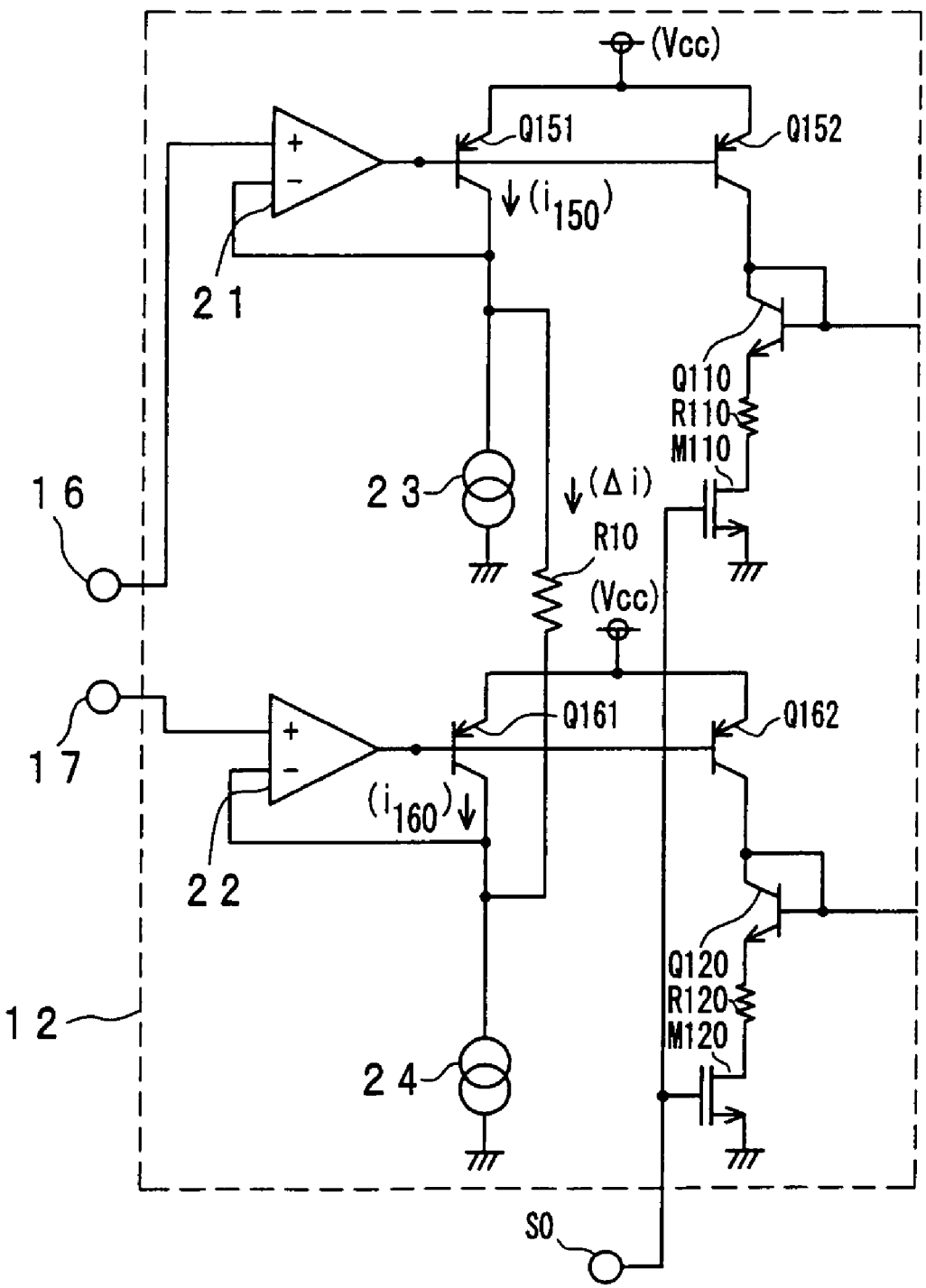
FIG. 14 is a circuit diagram showing another configuration example of a voltage-to-current converter 12.

It is to be noted that the voltage-to-current converter 12 can be modified to another configuration. FIG. 14 is a circuit diagram showing another configuration example of the voltage-to-current converter 12. As shown in FIG. 14, the voltage $V_{i1}$ of an input signal to the input terminal 16 is supplied to a non-inverting input terminal (+) of the operational amplifier 21 whose output voltage is in turn inputted to a base of a PNP transistor Q151. A collector of the PNP transistor Q151 is connected to the resistor R10 and the constant current source 23, while a collector voltage of the PNP transistor Q151 is fed back to an inverting input terminal (−) of the operational amplifier 21. An emitter of the PNP transistor Q151 is connected to the power source voltage $V_{cc}$. Thus, a voltage of the collector of the PNP transistor Q151 is fed back to the operational amplifier 21 and controlled to be equal to the voltage $V_{i1}$ of the input terminal 16. Similarly, a voltage of a collector of a PNP transistor Q161 is fed back to the operational amplifier 22 and controlled to be equal to the voltage $V_{i2}$ of the input terminal 17.

In this case, $\Delta i$ flowing through the resistor R10 is expressed in the following Equation (31), provided that $\Delta V_i = V_{i1} - V_{i2}$:

$$\Delta i = (V_{i1} - V_{i2}) / r_{10} = \Delta V_i / r_{10} \quad (31)$$

In this configuration, if output currents from the constant current sources 23 and 24 are both supposed to be $i_0$, a current $i_{150}$ that flows through the PNP transistor Q151 and a current $i_{160}$ that flows through the PNP transistor Q161 are given by the following Equations (32) and (33), respectively:

$$i_{150} = i_0 - \Delta i = i_0 - \Delta V_i / r_{10} \quad (32)$$

$$i_{160} = i_0 + \Delta i = i_0 + \Delta V_i / r_{10} \quad (33)$$

In this case, $i_{150} > 0$ and $i_{160} > 0$ are established, so that $\Delta i$ changes in a range of $-i_0$ through $+i_0$ in accordance with $\Delta V_i$. A voltage of $\Delta V_i$ required for causing $\Delta i$ to change in the range of $-i_0$ through $+i_0$ is $r_{10} \times i_0$. Conversely, even if $\Delta V_i$ in excess of this voltage is input, $\Delta i$ cannot follow a change in value of $\Delta V_i$. Therefore, this voltage provides a saturation input level of this variable gain amplifier. Further, the bases and the emitters of the PNP transistors Q151 and Q152 are commonly connected respectively, and the bases and the emitters of the PNP transistors Q161 and Q162 are commonly connected respectively. Therefore, a current flowing through the PNP transistor Q152 is equal to the current $i_{150}$ flowing through the PNP transistor Q151, and a current flowing through the PNP transistor Q162 is equal to the current $i_{160}$ flowing through the PNP transistor Q161. Furthermore, the collectors of the PNP transistors Q152 and the NPN transistor Q110 are commonly connected, so that the same current flows through the PNP transistor Q152 and the PNP transistor Q110. Further, the collectors of the PNP transistors Q162 and the NPN transistor Q120 are commonly connected, so that the same current flows through the PNP transistor Q162 and the PNP transistor Q120. Thus, it can be known that the voltage-to-current converter 12 shown in FIG. 14 and the voltage-to-current converter 12 shown in FIG. 2 work in the same way. It is to be noted that each of the two configurations shown in FIGS. 14 and 2 respectively can be used depending on a use properly.

Although in the above-described variable gain amplifier 11, to simplify description, it is supposed that the NPN transistors Q110-Q114 and Q120-Q124 have the same size and properties, the resistors R110-R114 and R120-124 have the same resistance, the N type MOS transistors M110-M114 and M120-M124 have the same size and properties, and the resistors R31 and R32 have the same resistance, they may be set as follows.

For example, it is supposed that each of the NPN transistors Q110 and Q120 has a size of 1, each of the NPN transistors Q111 and Q121 has a size of 4, each of the NPN transistors Q112 and Q122 has a size of 2, each of the NPN transistors Q113 and Q123 has a size of 1, and each of the NPN transistors Q114 and Q124 has a size of 1. Further, it is supposed that each of the N type MOS transistors M110 and M120 has a size of 1, each of the N type MOS transistors M111 and M121 has a size of 4, each of the N type MOS transistors M112 and M122 has a size of 2, each of the N type MOS transistors M113 and M123 has a size of 1, and each of the N type MOS transistors M114 and M124 has a size of 1. Further, it is supposed that each of the resistors R110 and R120 has a resistance of $r_0$, each of the resistors R111 and R121 has a resistance of $r_0/4$, each of the resistors R112 and R122 has a resistance of $r_0/2$, each of the resistors R113 and R123 has a resistance of $r_0$, and each of the resistors R114 and R124 has a resistance of $r_0$. In this configuration, the current amplification circuits 33 and 34 are in the same conditions as those of the variable gain amplifier 11 shown in FIG. 2, but, in the current amplification circuit 31, the NPN transistors and the N type MOS transistors respectively have four times the size and one-fourth the resistance value of the resistors. Therefore, the configuration is equivalent to the four current amplification circuits 31 integrated in parallel, thereby resulting in four times the current amplification factor of the current amplification circuit 31 shown in FIG. 2. Similarly, the current amplification circuit 32 has twice the current amplification factor of the current amplification circuit 32 shown in FIG. 2.

The following describes an operation of a modification of the variable gain amplifier 11. If the gain control voltage $V_{GC}$ inputted to the input terminal 18 is equal to the voltage $V_a$ shown in FIG. 3, the voltages that appear at the output terminals S1-S4 are each larger than the $V_{on}$ sufficiently. In this case, the following Equations (34) and (35) are established:

$$i_{11}=i_{111}+i_{112}+i_{113}+i_{114}=4\times i_{110}+2\times i_{110}+i_{110}+i_{110}=8\times i_{110} \quad (34)$$

$$i_{12}=i_{121}+i_{122}+i_{123}+i_{124}=4\times i_{120}+2\times i_{120}+i_{120}+i_{120}=8\times i_{120} \quad (35)$$

From these Equations (34) and (35), the following Equation (36) is given:

$$G_V=8\times G_0 \quad (36)$$

Next, if the gain control voltage $V_{GC}$ inputted to the input terminal 18 is equal to the voltage $V_b$ shown in FIG. 3, the N type MOS transistors M111 and M121 are turned off, so that the currents $i_{111}$ and $i_{121}$ are 0. Therefore, the following Equations (37) and (38) are established:

$$i_{11}=i_{111}+i_{112}+i_{113}+i_{114}=0\times i_{110}+2\times i_{110}+i_{110}+i_{110}=4\times i_{110} \quad (37)$$

$$i_{12}=i_{121}+i_{122}+i_{123}+i_{124}=0\times i_{120}+2\times i_{120}+i_{120}+i_{120}=8\times i_{120} \quad (38)$$

From these Equations (37) and (38), the following Equation (39) is given:

$$G_V=4\times G_0 \quad (39)$$

Similarly, if the gain control voltage $V_{GC}$ input to the input terminal 18 is equal to the voltage $V_c$ shown in FIG. 3, the gain $G_v$ is given by: Equation (40)

$$G_V=2\times G_0 \quad (40)$$

and if the gain control voltage $V_{GC}$ input to the input terminal 18 is equal to the voltage $V_d$ shown in FIG. 3, the gain $G_v$ is given by: Equation (41)

$$G_V=1\times G_0 \quad (41)$$

In such a manner, as the gain control voltage $V_{GC}$ decreases, the gain $G_v$ changes to $8G_0$, $4G_0$, $2G_0$, and $G_0$ in this order. A decibel gain calculated on the assumption that $20 \text{ LOG}(G_0)=GdB_0$ changes to $18+GdB_0$, $12+GdB_0$, $6+GdB_0$, and $GdB_0$ in this order as the gain control voltage $V_{GC}$ decreases. From this, it can be seen that, as the gain control voltage $V_{GC}$ changes, the decibel gain changes linearly in a step of 6 dB, that is, LOG(2)dB. By thus setting the current amplification factors of the current amplification circuits 31, 32, 33, and 34 to be 4, 2, 1, and 1 respectively, it is possible to change the decibel gain linearly in a step of 6 dB.

Similarly, if the current amplification factors of the current amplification circuits 31, 32, 33, and 34 are set to 18, 6, 2, and 1 respectively, the gain $G_v$ changes to $27G_0$, $9G_0$, $3G_0$, and $G_0$ in this order and the decibel gain changes to $28.6+GdB_0$, $19.1+GdB_0$, $9.5+GdB_0$, and $GdB_0$ in this order. From this, it can be seen that the decibel gain changes linearly in a step of 9.5 dB, that is, 20 LOG(3)dB. Although the current amplification factors of the current amplification circuits 31, 32, 33, and 34 have been respectively set to 18, 6, 2, and 1 as an example, they may be set to 9, 3, 1, and 0.5 or to 36, 12, 4, and 2, respectively.

It is to be noted that if N and n are supposed to be an integer of 2 or larger, N number of the current amplification circuits are provided, so that by setting a current amplification factor $N_1$ of the first one of these current amplification circuits to $\alpha_0$ and a current amplification factor Nn of the n-th one of these current amplification circuits to $N_n=\alpha_0\times(A-1)\times A^{(n-2)}$, it is possible to linearly change the decibel gain of the variable gain amplifier 11 in a step of 20 LOG(A).

Further, although, as for voltage values $V_b$, $V_c$, $V_d$, $V_e$ of the gain control voltage $V_{GC}$ shown in FIG. 3, the voltage differences $V_b-V_c$, $V_c-V_d$, and $V_d-V_e$ are supposed to be equal to each other, they need not necessarily be equal to each other; by adjusting these voltage differences, and it is possible to improve the linearity of a change in gain with respect to the gain control voltage.

Further, of course, the variable gain amplifier 11 according to the second embodiment can also satisfy the three features of low dissipation power, low distortion, and gain continuity similarly to the variable gain amplifier 1 according to the first embodiment.

Figure 15:
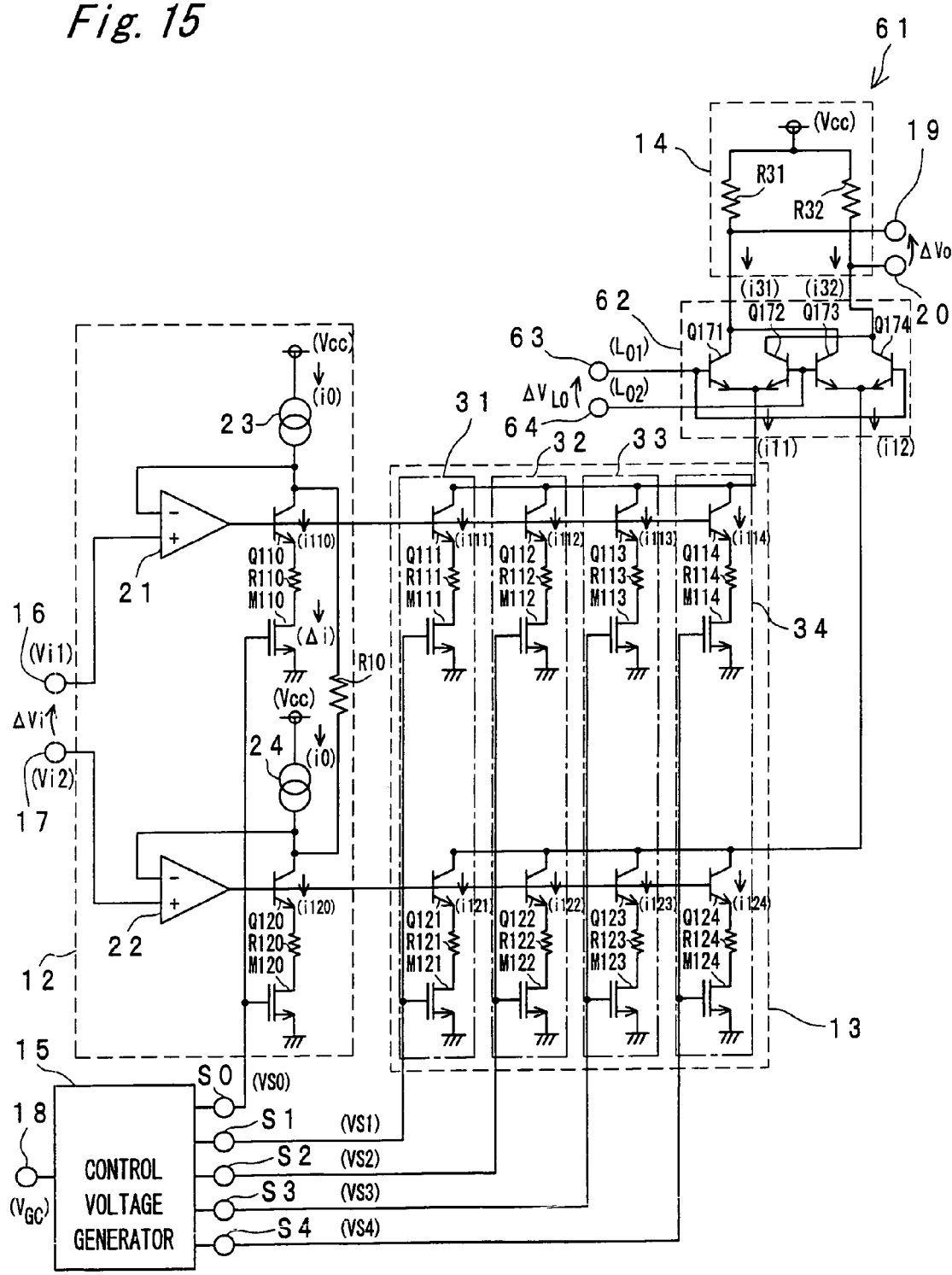
FIG. 15 is a circuit diagram showing a mixer that uses the variable gain amplifier 11 according to the second embodiment of the present invention.

A variable gain amplifier according to the present invention can be used in a mixer or a quadrature modulator. The following describes a mixer and a quadrature modulator using a variable gain amplifier according to the present invention. FIG. 15 is a circuit diagram showing a mixer that uses the variable gain amplifier 11 according to the present invention. As shown in FIG. 15, a mixer 61 includes a variable gain amplifier that includes the voltage-to-current converter 12, current amplifier 13, current-to-voltage converter 14, and control voltage generator 15, and further includes a Gilbert cell section 62 which constitutes a mixing unit. The voltage-to-current converter 12, the current amplifier 13, the current-to-voltage converter 14, and the control voltage generator 15 have the same configurations as those shown in FIG. 2, and the description thereof is omitted. The external voltages $V_{i1}$ and $V_{i2}$ having a voltage difference $\Delta V_i$ are input to the input terminals 16 and 17 of the voltage-to-current converter 12. Meanwhile, conversion gain control signals Lo1 and Lo2 having a voltage difference $\Delta V_{Lo}$ are externally applied to input terminals 63 and 64 of the Gilbert cell section 62, and the output signals having a voltage difference $\Delta V_o$ are obtained from the output terminals 19 and 20 of the current-to-voltage converter 14 as a gain-controlled signal by multiplying the voltage differences $\Delta V_i$ and $\Delta V_{Lo}$.

The Gilbert section 62 includes four NPN transistors Q171-Q174. Bases of the NPN transistors Q171 and Q174 are connected commonly and bases of the NPN transistors Q172 and Q173 are connected commonly. A voltage inputted to the input terminal 63 is applied to the bases of the NPN transistors Q171 and Q174, and a voltage inputted to the input terminal 64 is applied to the bases of the NPN transistors Q172 and Q173. Further, collectors of the NPN transistors Q171 and Q173 are connected commonly and collectors of the NPN transistors Q172 and Q174 are connected commonly. The resistor R31 of the current-to-voltage converter 14 is connected to the collectors of the NPN transistors Q171 and Q173, and the resistor R32 of the current-to-voltage converter 14 is connected to the collectors of the NPN transistors Q172 and Q174.

The following describes an operation of the mixer 61. If the voltage difference $\Delta V_{Lo}$ between the input voltages Lo1 and Lo2 at the input terminals 63 and 64 of the Gilbert cell section 62 is properly large, the NPN transistors Q171-Q174 in the Gilbert cell section 62 operate as simple current-transfer switches controlled by the voltage difference $\Delta V_{Lo}$. That is, if the input terminals 63 and 64 of the Gilbert cell section 62 are supplied with a properly large voltage difference $\Delta V_{Lo}$ and a voltage applied to the input terminal 63 is larger than a voltage applied to the input terminal 64 ($\Delta V_{Lo}>0$), the NPN transistors Q171 and Q174 are turned on and the NPN transistors 172 and 173 are turned off. In this case, currents $i_{31}$ and $i_{32}$ flowing through the resistors R31 and R32 in the current-to-voltage converter 14 respectively are $i_{31}=i_{11}$ and $i_{32}=i_{12}$, so that if R31=R32=$r_{30}$ is assumed, the output voltage difference $\Delta V_o$ obtained from the output terminals 19 and 20 of the current-to-voltage converter 14 is given by the following Equation (42):

$$\Delta V_o = r_{30} \times (i_{32}-i_{31}) = r_{30} \times (i_{12}-i_{11}) \quad (42)$$

On the other hand, if a voltage applied to the input terminal 63 of the Gilbert cell section 62 is smaller than a voltage applied to the input terminal 64 (i.e., $\Delta V_{Lo}<0$), the NPN transistors Q171 and Q174 are turned off and the NPN transistors 172 and 173 are turned on. In this case, the currents $i_{31}$ and $i_{32}$ flowing through the resistors R31 and R32 in the current-to-voltage converter 14 respectively are $i_{31}=i_{12}$ and $i_{32}=i_{11}$, so that the output voltage difference $\Delta V_o$ obtained from the output terminals 19 and 20 of the current-to-voltage converter 14 is given by the following Equation (43):

$$\Delta V_o = r_{30} \times (i_{32}-i_{31}) = r_{30} \times (i_{11}-i_{12}) \quad (43)$$

That is, the output voltage difference $\Delta V_o$ has the same frequency as the input voltage difference $\Delta V_{Lo}$ and is given by multiplying a square wave having an amplitude of ±1 and $r_{30} \times (i_{12}-i_{11})$. If the gain $G_v$ of the variable gain amplifier 11 according to the second embodiment is applied in this case, the voltage difference can be given by Equations (44) and (45) as follows:

$$\Delta V_o = G_V \times \Delta V_i (\Delta V_{Lo} > 0) \quad (44)$$

$$\Delta V_o = -G_V \times \Delta V_i (\Delta V_{Lo} < 0) \quad (45)$$

Accordingly, the gain $G_v$ can be controlled by using the gain control voltage $V_{GC}$ inputted to the input terminal 18.

Similarly, in the case of this mixer 61 also, although a current is large if the gain $G_v$ is high and the output voltage difference $\Delta V_o$ is large, the current can be decreased if the gain is low and the output voltage difference $\Delta V_o$ is small. Therefore, a mixer that uses a variable gain amplifier according to the present invention can satisfy a feature of dissipation power being low if the gain is small and the output level is low. Further, a mixer that uses a variable gain amplifier according to the present invention can satisfy a feature that even if a gain is changed, a saturation input level remains unchanged with distortion being low. Further, a mixer that uses a variable gain amplifier according to the present invention can easily realize linearity of a continuous gain irrespective of a value of the gain control voltage.

Further, in the mixer that uses a variable gain amplifier according to the present invention, it is possible to always switch the NPN transistors Q171-Q174 in the Gilbert cell section 62 while a level of $\Delta V_{Lo}$ is unchanged during the gain control. Generally, better distortion and noise characteristics can be obtained by always switching the NPN transistors in the Gilbert section 62 in use. Therefore, a mixer that uses the variable gain amplifier 11 according to the present invention can realize gain control while keeping up good distortion and noise characteristics of the Gilbert cell section 62.

Further, similarly to the variable gain amplifier 11 according to the second embodiment, by constituting the current-to-voltage converter 14 of an inductor rather than a resistor, an amplitude of a voltage at the output terminals 19 and 20 can be increased, thereby increasing the gain $G_v$ of the mixer 61. Further, by constituting the current-to-voltage converter 14 of an inductor and a capacitor connected in parallel to each other, the gain $G_v$ of the mixer 61 can be increased.

Figure 16:
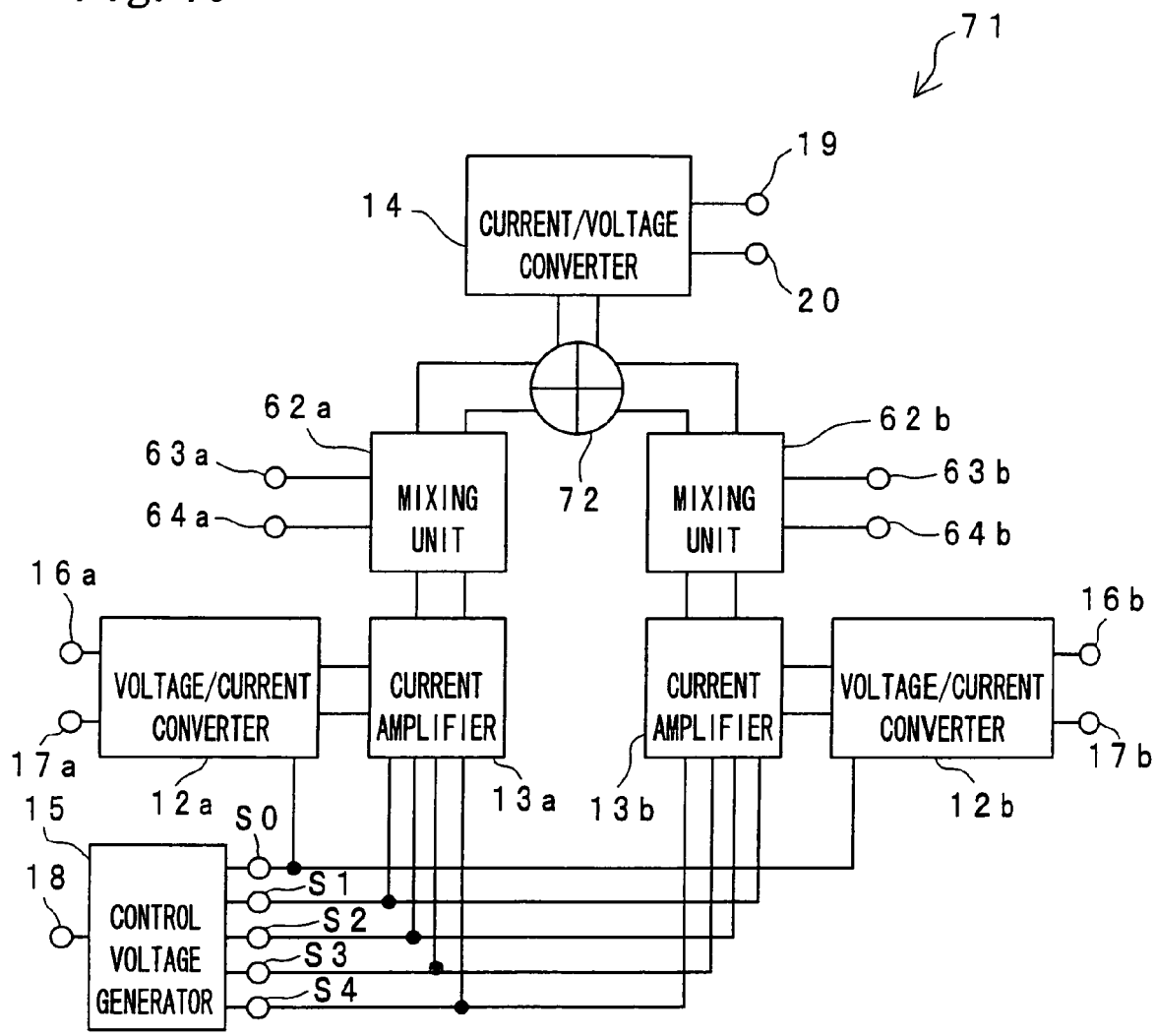
FIG. 16 shows a circuit diagram of a quadrature modulator that uses the variable gain amplifier 11 according to the second embodiment of the present invention.

Further, the above-described mixers 61 can be combined to realize a quadrature modulator. FIG. 16 shows a block diagram showing a configuration example of a quadrature modulator 71 that uses a variable gain amplifier according to the present invention. As shown in FIG. 16, the quadrature modulator 71 includes voltage-to-current converters 12a and 12b, current amplifiers 13a and 13b, a control voltage generator 15, mixing units 62a and 62b, a current-to-voltage converter 14, and an adder 72. Each of the mixing units 62a and 62b corresponds to the Gilbert cell section 62 in the mixer 61. The configurations of the voltage-to-current converters 12a and 12b, current amplifiers 13a and 13b, control voltage generator 15, mixing units 62a and 62b, current-to-voltage converter 14 have already been described. A voltage $V_{ia}$ inputted to input terminals 16a and 17a of the voltage-to-current converter 12a is mixed in accordance with a conversion gain control signal Lo1 inputted to input terminals 63a and 64a of the mixing unit 62a. Meanwhile, a voltage $V_{inb}$ inputted to input terminals 16b and 17b of the voltage-to-current converter 12b is mixed in accordance with a conversion gain control signal Lo2 inputted to input terminals 63b and 64b of the mixing unit 62b. Output signals of the mixing units 62a and 62b are added up by the adder 72 and the added signal is converted by the current-to-voltage converter 14 to provide output voltage signals. It is to be noted here that the output signals Lo2 and Lo1 have the same frequency and amplitude and different phases shifted by 90 degrees from each other.

In this quadrature modulator 71, although a current is large if the gain $G_v$ is high and the output voltage difference $\Delta V_o$ is large, the current can be decreased if the gain is low and the output voltage difference $\Delta V_o$ is small. Therefore, the quadrature modulator that uses a variable gain amplifier according to the present invention can satisfy a feature of dissipation power being low if the gain is small and the output level is low. Further, the quadrature modulator that uses a variable gain amplifier according to the present invention can satisfy a feature that even if a gain is changed, a saturation input level remains unchanged with distortion being low. Further, the quadrature modulator that uses a variable gain amplifier according to the present invention can easily realize linearity of a continuous gain irrespective of a value of the gain control voltage.

Further, when using a quadrature modulator that uses a variable gain amplifier according to the present invention, it is possible to always switch the NPN transistors in the mixing units 62a and 62b while a level of $\Delta V_{Lo}$ remains unchanged during the gain control operation. Generally, better distortion and noise characteristics can be obtained by always switching the NPN transistors in these mixing units 62a and 62b in use. Therefore, a quadrature modulator that uses the variable gain amplifier 11 according to the present invention can realize the gain control while keeping up good distortion and noise characteristics of the mixing units 62a and 62b.

A variable gain amplifier according to the present invention can satisfy the three features of lower power dissipation, low distortion, and gain continuity simultaneously and it is useful as an amplifier to be used in a transmission section of, for example, a CDMA wireless terminal.

What is claimed is:

1. A variable gain amplifier comprising:
   a voltage-to-current converter for converting an input voltage into a current;
   a current amplifier for amplifying the current convened by the voltage-to-current converter;
   a current-to-voltage converter for converting the current amplified by the current amplifier into a voltage and outputting the resulting voltage; and
   a controller for controlling a gain of the variable gain amplifier by varying an amplification factor of the current amplifier in accordance with a gain control signal.

2. The variable gain amplifier according to claim 1, wherein the current amplifier has a current mirror circuit which inputs the current converted by the voltage-to-current converter, and the current mirror circuit has an output-side transistor connected to a variable resistor in series, and
   wherein the controller varies a resistance of the variable resistor in accordance with the gain control signal, thereby varying a ratio of an output current to an input current of the current minor circuit.

3. The variable gain amplifier according to claim 2, wherein the variable resistor is constituted of an MOS transistor, and the controller varies a control voltage of the MOS transistor in accordance with the gain control signal.

4. The variable gain amplifier according to claim 1, wherein the current amplifier has a plurality of current amplification circuits each amplifying the current converted by the voltage-to-current converter and outputting the amplified current, and the controller varies an amplification factor of each of the current amplification circuits in accordance with the gain control signal, and the current-to-voltage converter converts a total sum of currents outputted from the current amplification circuits into a voltage.

5. The variable gain amplifier according to claim 4, wherein the voltage-to-current converter has a pair of first and second transistors through each of which a current converted from the input voltage flows, and each of the current amplification circuits has a pair of third and fourth transistors to constitute a group of third transistors and a group of fourth transistors in the current amplifier,
   wherein base electrodes of the group of the third transistors are commonly connected to the base of the first transistor and collector electrodes of the group of the third transistors are commonly connected so that a current proportional to a current flowing through the first transistor flows through each of the group of the third transistors, and base electrodes of the group of the fourth transistors are commonly connected to the base of the second transistor and collector electrodes of the group of the fourth transistors are commonly connected so that a current proportional to a current flowing through the second transistor flows through each of the group of the fourth transistors, and
   wherein the controller varies a quantity of a current flowing through each of the third and fourth transistors in accordance with the gain control signal, and the current-to-voltage converter converts a total sum of currents flowing through the group of the third transistors and the group of the fourth transistors into a voltage.

6. The variable gain amplifier according to claim 5, wherein each of the current amplification circuits has a variable resistor connected in series to each of the third transistors and a variable resistor connected in series to each of the fourth transistors, and the controller varies a resistance of each of the variable resistors in accordance with the gain control signal.

7. The variable gain amplifier according to claim 5, wherein each of the current amplification circuits has a MOS transistor connected in series to each of the third transistors and a MOS transistor connected in series to each of the fourth transistors, and the controller varies a control voltage of each of the MOS transistors in accordance with the gain control signal, thereby varying a quantity of a current flowing through each of the third and fourth transistors.

8. The variable gain amplifier according to claim 7, wherein the controller has a constant voltage generator that generates a constant voltage to be applied to each of the current amplification circuits and a plurality of control voltage generators each of which generates and outputs a control voltage to be applied to each pair of the MOS transistors in each of the current amplification circuits, and
   wherein each of the control voltage generators has a differential amplification circuit to which a constant voltage generated by the constant voltage generator and a voltage of the gain control signal are inputted to the input terminals thereof, respectively, a current mirror circuit whose input-side transistor constitutes a load of one of a couple of differential transistors of the differential amplification circuit, and a voltage output section for converting an output current of the current minor circuit into a voltage and outputting the resultant converted voltage.

9. The variable gain amplifier according to claim 1, wherein the current-to-voltage converter is comprised of a resistor or an inductor.

10. The variable gain amplifier according to claim 1, wherein the current-to-voltage converter has an inductor and a capacitor connected in parallel to each other.

11. A mixer which converts a frequency of an input voltage in accordance with a conversion gain control signal supplied from an outside and outputs the resulting voltage having a frequency converted, said mixer comprising:
    a voltage-to-current converter for converting the input voltage into a current;
    a current amplifier for amplifying the current converted by the voltage-to-current converter;
    a controller for controlling an amplification factor of the current amplifier in accordance with a gain control signal;
    a mixing unit for converting the frequency of the current amplified by the current amplifier, in accordance with the conversion gain control signal; and
    a current-to-voltage converter for converting the resulting frequency-converted current into a voltage.

12. The mixer according to claim 11, wherein the current amplifier has a current mirror circuit which inputs the current converted by the voltage-to-current converter, and the current mirror circuit has an output-side transistor connected to a variable resistor in series, and
    wherein the controller varies a resistance of the variable resistor in accordance with the gain control signal, thereby varying a ratio of an output current to an input current of the current mirror circuit.

13. The mixer according to claim 12, wherein the variable resistor is constituted of a MOS transistor and the controller varies a control voltage of the MOS transistor in accordance with the gain control signal.

14. The mixer according to claim 11, wherein the current amplifier has a plurality of current amplification circuits each amplifying the current converted by the voltage-to-current converter and outputting the amplified current, and wherein the controller varies an amplification factor of each of the current amplification circuits in accordance with the gain control signal, and the current-to-voltage converter converts a total sum of currents outputted from the current amplification circuits into a voltage.

15. The mixer according to claim 14, wherein the voltage-to-current converter has a pair of first and second transistors through each of which a current converted from the input voltage flows, and each of the current amplification circuits has a pair of third and fourth transistors to constitute a group of third transistors and a group of fourth transistors in the current amplifier, wherein base electrodes of the group of the third transistors are commonly connected to the base of the first transistor and collector electrodes of the group of the third transistors are commonly connected so that a current proportional to a current flowing through the first transistor flows through each of the group of the third transistors, and base electrodes of the group of the fourth transistors are commonly connected to the base of the second transistor and collector electrodes of the group of the fourth transistors are commonly connected so that a current proportional to a current flowing through the second transistor flows through each of the group of the fourth transistors, and wherein the controller varies a quantity of a current flowing through each of the third and fourth transistors in accordance with the gain control signal, and the current-to-voltage converter converts a total sum of currents flowing through the group of the third transistors and the group of the fourth transistors into a voltage.

16. The mixer according to claim 15, wherein each of the current amplification circuits has a variable resistor connected in series to each of the third transistors and a variable resistor connected in series to each of the fourth transistors, and the controller varies a resistance of each of the variable resistors in accordance with the gain control signal.

17. The mixer according to claim 15, wherein each of the current amplification circuits has a MOS transistor connected in series to each of the third transistors and a MOS transistor connected in series to each of the fourth transistors, and the controller varies a control voltage of each of the MOS transistors in accordance with the gain control signal, thereby varying a quantity of a current flowing through each of the third and fourth transistors.

18. The mixer according to claim 17, wherein the controller has a constant voltage generator that generates a constant voltage to be applied to each of the current amplification circuits and a plurality of control voltage generators each of which generates and outputs a control voltage to be applied to each pair of the MOS transistors in each of the current amplification circuits, and wherein each of the control voltage generators has a differential amplification circuit to which a constant voltage generated by the constant voltage generator and a voltage of the gain control signal are inputted to the input terminals thereof, respectively, a current mirror circuit whose input-side transistor constitutes a load of one of a couple of differential transistors of the differential amplification circuit, and a voltage output section for converting an output current of the current minor circuit into a voltage and outputting the resultant converted voltage.

19. The mixer according to claim 11, wherein the current-to-voltage converter is comprised of a resistor or an inductor.

20. The mixer according to claim 11, wherein the current-to-voltage converter has an inductor and a capacitor connected in parallel to each other.

21. A quadrature modulator which includes a pair of mixers, an adder for adding up output currents of the mixers, and a current-to-voltage converter for converting an output current of the adder into a voltage, wherein each of the mixers comprises:

a voltage-to-current converter for converting an input voltage into a current;

a current amplifier for amplifying the current converted by the voltage-to-current converter;

a controller for controlling an amplification factor of the current amplifier in accordance with a gain control signal; and a mixing unit for converting a frequency of the current amplified by the current amplifier, in accordance with a conversion gain control signal.

22. The quadrature modulator according to claim 21, wherein the current amplifier has a current mirror circuit which inputs the current converted by the voltage-to-current converter, and the current mirror circuit has an output-side transistor connected to a variable resistor in series, and wherein the controller varies a resistance of the variable resistor in accordance with the gain control signal, thereby varying a ratio of an output current to an input current of the current mirror circuit.

23. The quadrature modulator according to claim 22, wherein the variable resistor is constituted of a MOS transistor and the controller varies a control voltage of the MOS transistor in accordance with the gain control signal.

24. The quadrature modulator according to claim 21, wherein the current amplifier has a plurality of current amplification circuits each amplifying the current converted by the voltage-to-current converter and outputting the amplified current, and wherein the controller varies an amplification factor of each of the current amplification circuits in accordance with the gain control signal, and the current-to-voltage converter converts a total sum of currents outputted from the current amplification circuits into a voltage.

25. The quadrature modulator according to claim 24, wherein the voltage-to-current converter has a pair of first and second transistors through each of which a current converted from the input voltage flows, and each of the current amplification circuits has a pair of third and fourth transistors to constitute a group of third transistors and group of fourth transistors in the current amplifier, wherein base electrodes of the group of the third transistors are commonly connected to the base of the first transistor and collector electrodes of the group of the third transistors are commonly connected so that a current proportional to a current flowing through the first transistor flows through each of the group of the third transistors, and base electrodes of the group of the fourth transistors are commonly connected to the base of the second transistor and collector electrodes of the group of the fourth transistors are commonly connected so that a current proportional to a current flowing through the second transistor flows through each of the group of the fourth transistors, and wherein the controller varies a quantity of a current flowing through each of the third and fourth transistors in accordance with the gain control signal, and the current-to-voltage converter converts a total sum of currents flowing through the group of the third transistors and the group of the fourth transistors into a voltage.

26. The quadrature modulator according to claim 25, wherein each of the current amplification circuits has a variable resistor connected in series to each of the third transistors and a variable resistor connected in series to each of the fourth transistors, and the controller varies a resistance of each of the variable resistors in accordance with the gain control signal.

27. The quadrature modulator according to claim 25, wherein each of the current amplification circuits has a MOS transistor connected in series to each of the third transistors and a MOS transistor connected in series to each of the fourth transistors, and the controller varies a control voltage of each of the MOS transistors in accordance with the gain control signal, thereby varying a quantity of a current flowing through each of the third and fourth transistors.

28. The quadrature modulator according to claim 27, wherein the controller has a constant voltage generator that generates a constant voltage to be applied to each of the current amplification circuits and a plurality of control voltage generators each of which generates and outputs a control voltage to be applied to each pair of the MOS transistors in each of the current amplification circuits, and wherein each of the control voltage generators has a differential amplification circuit to which a constant voltage generated by the constant voltage generator and a voltage of the gain control signal are inputted to the input terminals thereof respectively, a current mirror circuit whose input-side transistor constitutes a load of one of a couple of differential transistors of the differential amplification circuit, and a voltage output section for converting an output current of the current mirror circuit into a voltage and outputting the resultant converted voltage.

29. The quadrature modulator according to claim 21, wherein the current-to-voltage converter is comprised of a resistor or an inductor.

30. The quadrature modulator according to claim 21, wherein the current-to-voltage converter has an inductor and a capacitor connected in parallel to each other.

* * * * *